(12) United States Patent
Meissner

(10) Patent No.: US 9,374,929 B1
(45) Date of Patent: Jun. 21, 2016

(54) MODULAR INTEGRATED MOBILE COOLING SYSTEM AND METHODS OF OPERATION THEREOF

(71) Applicant: Alan P. Meissner, Franklin, WI (US)

(72) Inventor: Alan P. Meissner, Franklin, WI (US)

(73) Assignee: SILVER LININGS SYSTEMS, LLC, Kenosha, WI (US)

( * ) Notice: Subject to any disclaimer, the term of this patent is extended or adjusted under 35 U.S.C. 154(b) by 866 days.

(21) Appl. No.: 13/648,113

(22) Filed: Oct. 9, 2012

Related U.S. Application Data

(63) Continuation of application No. 12/707,543, filed on Feb. 17, 2010, now Pat. No. 8,331,086.

(60) Provisional application No. 61/153,198, filed on Feb. 17, 2009, provisional application No. 61/172,104, filed on Apr. 23, 2009.

(51) Int. Cl.
*H05K 7/20* (2006.01)

(52) U.S. Cl.
CPC .................................. *H05K 7/20127* (2013.01)

(58) Field of Classification Search
None
See application file for complete search history.

(56) References Cited

U.S. PATENT DOCUMENTS

| | | | | |
|---|---|---|---|---|
| 6,034,873 A * | 3/2000 | Ståhl | ................... | H05K 7/20745 165/80.3 |
| 7,961,463 B2 * | 6/2011 | Belady | ............... | H05K 7/20745 312/223.6 |
| 8,320,128 B2 * | 11/2012 | Wei | ........................... | G06F 1/20 165/104.19 |
| 8,331,087 B2 * | 12/2012 | Wei | ...................... | H05K 7/1497 174/520 |
| 8,405,977 B2 * | 3/2013 | Lin | .................... | H05K 7/20736 312/223.2 |
| 8,734,212 B2 * | 5/2014 | Peng | .................... | H05K 7/1497 361/695 |
| 2005/0170770 A1 * | 8/2005 | Johnson | ............. | H05K 7/20836 454/184 |
| 2007/0135032 A1 * | 6/2007 | Wang | ........................ | F24F 9/00 454/184 |
| 2008/0055846 A1 * | 3/2008 | Clidaras | .................... | G06F 1/20 361/679.41 |
| 2008/0305733 A1 * | 12/2008 | Noteboom | ......... | H05K 7/20745 454/184 |
| 2012/0077427 A1 * | 3/2012 | Wei | .................... | H05K 7/20745 454/184 |

* cited by examiner

*Primary Examiner* — Courtney Smith
(74) *Attorney, Agent, or Firm* — Brennen Law Office, LLC

(57) ABSTRACT

According to one embodiment of the present invention, a system is provided having a foundation that is modular in design. Each module has transport structures. Floor sections can be provided. A bearing plate can be provided on top of isolators supported on a foundation. A skeleton can also be constructed, which can support a heat exchanger assembly, which includes a plenum, a heat exchanger and air movers. A ducting assembly with boxes is supported by the skeleton. An equipment rack, such as a server rack, can be supported on the bearing plate. Any number of systems can be attached end to end, back to back, and/or vertically to form a system of a desired dimension. The entire system, once assembled and wired, can easily be moved with a transport assembly. The system can also be expanded in size and capacity as the operational needs increase.

6 Claims, 22 Drawing Sheets

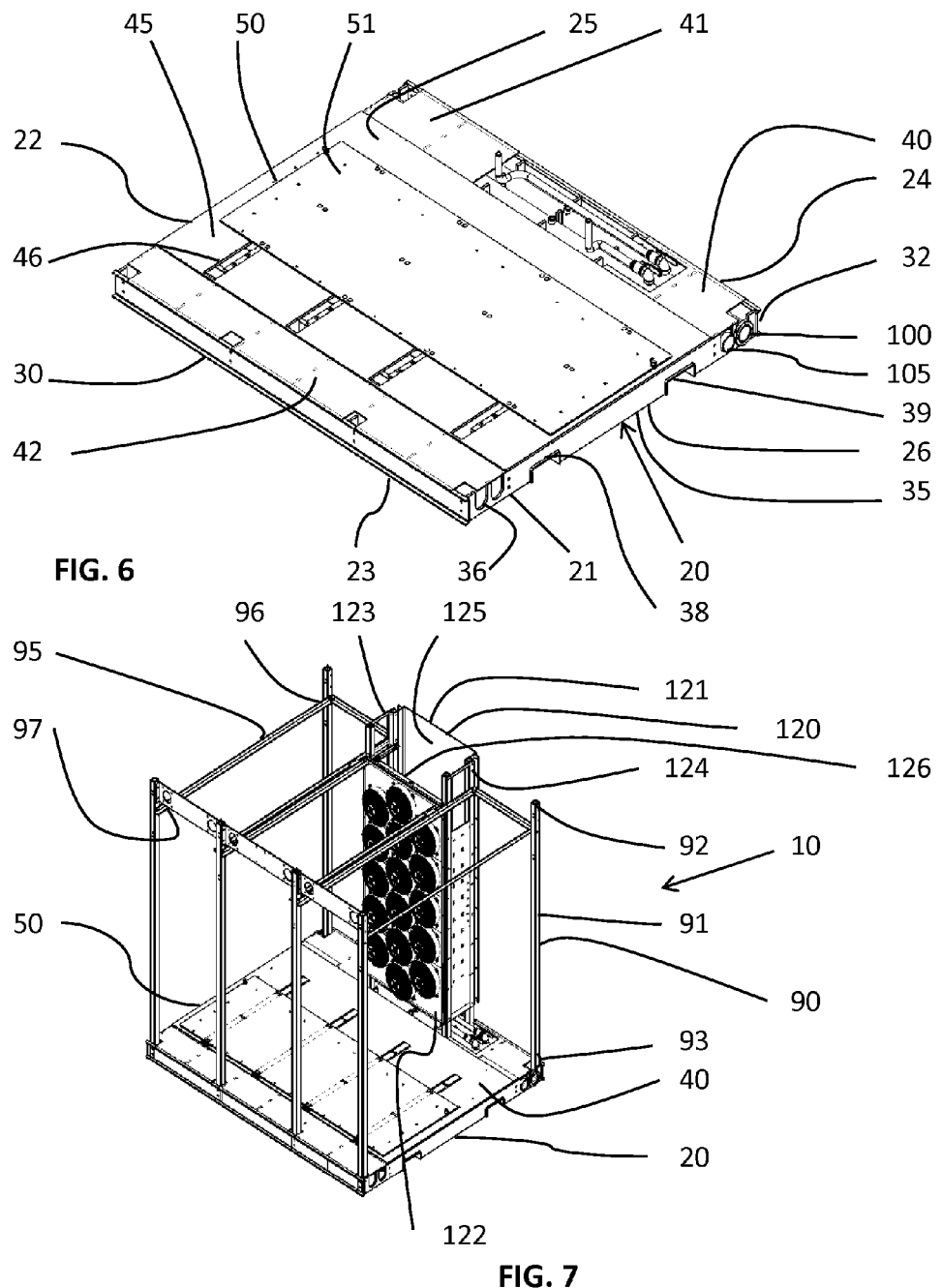

MODULAR INTEGRATED MOBILE COOLING SYSTEM AND METHODS OF OPERATION THEREOF

This patent application claims priority on and the benefit of currently pending nonprovisional application Ser. No. 12/707,543 filed Feb. 17, 2010, which itself claims priority on and the benefit of provisional application 61/153,198 filed Feb. 17, 2009 and of provisional application 61/172,104 filed Apr. 23, 2009, the entire contents of each are hereby incorporated herein by reference.

BACKGROUND OF THE INVENTION

1. Field of the Invention

The present invention relates to cooling system that is modular in design, has integrated cooling components and that can be selectively used in mobile and/or stationary environments.

2. Description of the Related Art

Cooling of electronic equipment is a major concern for proper operation of the equipment. No matter the equipment type (servers, telecommunication, medical imaging devices, acoustic components, circuits and/or otherwise), heat dissipation is a primary design and operational concern. Fortunately, many solutions are available when the equipment is used in a stand alone environment. One solution is to rely on the ambient air to cool the equipment. On board fans may provide convective cooling in this endeavor.

However, when density of the electronic equipment is increased, the challenge of keeping the equipment within preferred operational temperatures also increases. The challenge of operating at a consistent and low temperature in order to maximize equipment life also increases with the density.

In one particular situation, there is a desire to have many servers confined within a single space. Such a space is typically called a server room on a small scale and a data center on a larger scale. There is a need to have modular server rooms and data centers that can be expanded as the user's requirements grow. There is also a need to have a mobile server room or data center that can be transported from one location to another (from simply across a facility to all the way across international boundaries). There is, as of yet, not been a solution that provides acceptable cooling results.

Thus, there exists a need for a modular integrated cooling system that solves these and other problems.

SUMMARY OF THE INVENTION

The present invention relates to cooling system that is modular in design, has integrated cooling components and that can be used and easily transported in a mobile environment and/or used in a stationary environment.

According to one embodiment of the present invention, a system is provided having a foundation that is modular in design. The foundation is structural with a transport structure, such as fork pockets. Removable floor sections are also provided. A load bearing surface such as a plate can be provided on top of isolators and supported on the foundation. A skeleton can be constructed on top of the foundation. The skeleton supports the heat exchanger assembly, which includes a plenum, a heat exchanger and air movers. A ducting assembly with boxes is supported by the skeleton. An equipment rack, such as a server rack, can be supported on the bearing plate. Any number of systems can be attached end to end to form a system of a desired length. The entire system, once assembled and wired, can easily be conjoined or moved to a desired destination such as a container. The system can also be expanded in size and capacity as the operational needs increase.

According to one advantage of an embodiment of the present invention, the system is scalable in that it can be expanded after it is operational. In this regard, the system is scalable as necessary when necessary.

In another preferred embodiment, the modules can be attached back-to-back, side-to-side, and/or vertically.

In still another preferred embodiment, a translating load bearing surface can be provided to allow translation of equipment within the module relative the foundation or stationary floor. Advantageously, access for maneuverability, serviceability and/or electronic component replacement is enhanced. Specifically, and without limitation, a full depth server can be replaced within the present invention. Also, the location of the components within the module can be precisely situated for optimum heat dissipation.

According to another advantage of the present invention, the structure can be made of a variety of materials selected for strength, weight and economic reasons. Two such materials are steel and aluminum.

According to another advantage of the present invention, each assembly is designed for individual or modularly linked uses. When a linked assembly is provided, each individual foundation is simply connected together with bolts or other types of removable fasteners in an end to end longitudinal arrangement, in a back-to-back arrangement, and in addition to or as an alternative to, in a vertically stacked arrangement.

According to a still further advantage of an embodiment of the present invention, the equipment can first be installed onto a load bearing surface, and then the walls can be put in place. The electronic equipment can be assembled and wired when the foundation is outside of a container. A fork lift or other transport device such as an overhead lift can then be used to move the full assembly into a container after assembly is accomplished. One of many possible containers is a HI-Cube ISO container. Yet, it is appreciated that the principles of the present inventions can be applied and incorporated into a design involving many different types of containers, including, without limitation, standard shipping containers, rail cars and on site drop over covers. Still further, the present invention can be fitted with insulated wall panels for stand-alone applications independent of an external container without departing from the broad aspects of the present invention.

According to a still further advantage yet of the present invention, the equipment is segregated from the cooling elements. This is accomplished in some embodiments of the present invention by locating the ducting and heat exchanger within the walls, and running the piping under floor sections. Related, the floor sections can be removable and can have openings there through. This advantageously allows for any liquid to fall through the openings and be collected remote from the equipment. Thus, there is a decreased risk of liquid coming into contact with the electronics.

According to still further advantage yet of one embodiment of the present invention, a hot aisle and a cold aisle can be provided within each module. This advantageously allows workers to have access to both sides of the equipment even when the equipment is located inside a container.

According to a still further advantage yet of a preferred embodiment of the present invention, two modules can be fixed in a back-to-back orientation. This advantageously allows for two cold aisles and one hot aisle to be defined and for common elements (of former distinct hot aisles) to be eliminated.

According to still further advantage yet of the present invention, isolators are provided for protecting the equipment from vibrations and shocks. One type of isolator can comprise a pair of springs.

According to still further advantage yet of the present invention, a full stratification of cooled air can be achieved to improve equipment cooling. This can be accomplished through the use of the geometry of the natural currents and forced air apparatuses when necessary.

According to a still further advantage of the present invention, several modes of operation can be utilized. For example, the air can be re-circulated, cooled (examples such as direct cooling and direct expansion), humidified, or simply drawn and filtered from the environment and passed through the system and/or a combination or mixture thereof, as desired. In one operational embodiment where a combination of these modes is desired, a real time feedback control can be used to sense environmental conditions and make electro-mechanical adjustments to the system to achieve necessary and desired heat dissipation.

According to still further advantage yet of an embodiment of the present invention, the ducting can comprise clear panels that allow light to pass through.

Other advantages, benefits, and features of the present invention will become apparent to those skilled in the art upon reading the detailed description of the invention and studying the drawings.

BRIEF DESCRIPTION OF THE DRAWINGS

FIG. 6 is a perspective isolation view of a preferred foundation of the present invention.

FIG. 7 is a perspective isolation view of a preferred foundation, skeleton and plenum of the present invention.

DETAILED DESCRIPTION OF PREFERRED EMBODIMENTS

Figure 1:
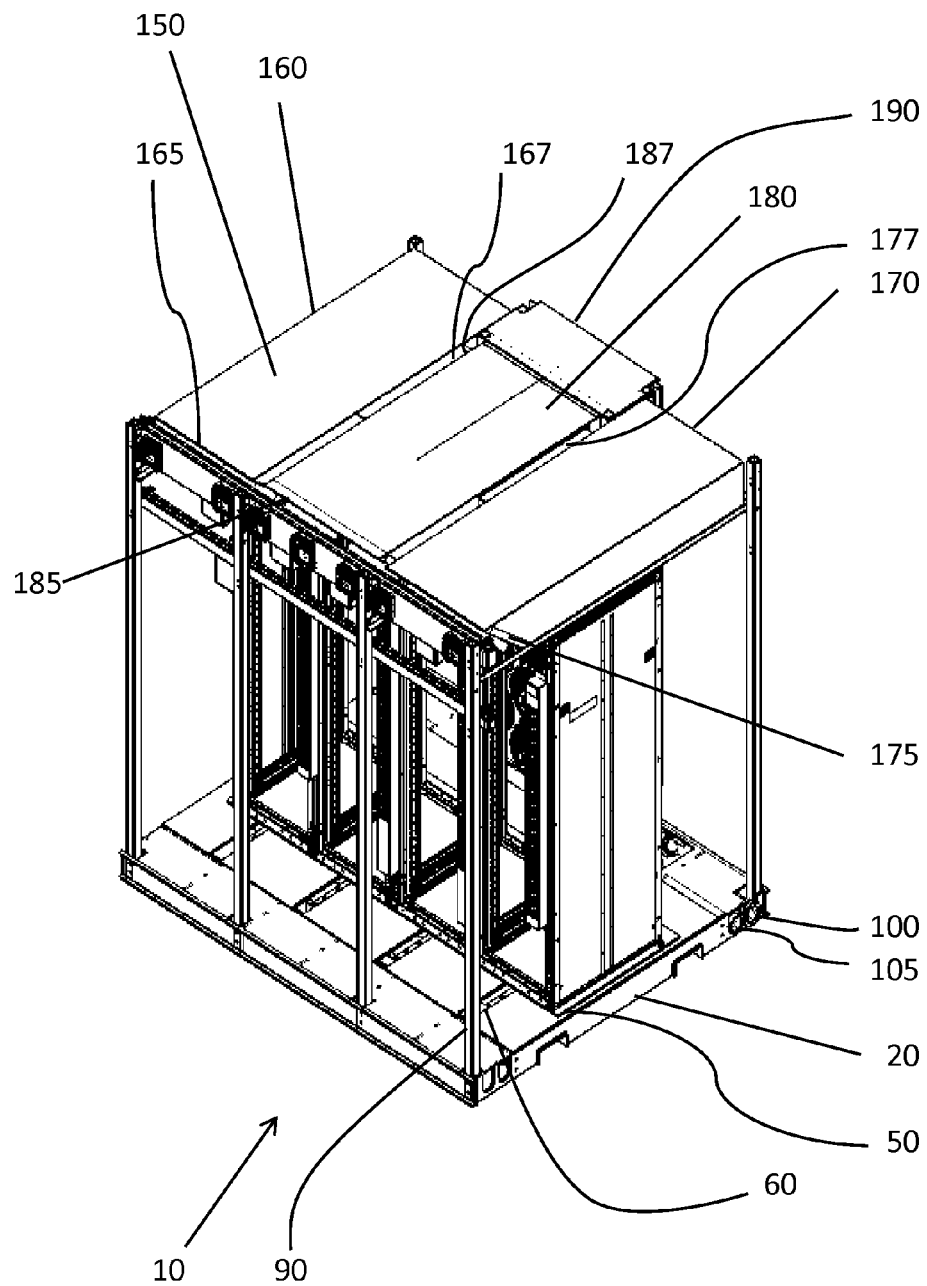
FIG. 1 is a perspective view of a preferred embodiment of the present invention.

While the invention will be described in connection with several preferred embodiments, it will be understood that it is not intended to limit the invention to those embodiments. On the contrary, it is intended to cover all alternatives, modifications and equivalents as may be included within the spirit and scope of the invention as defined by the appended claims.

Turning now to FIGS. 1-19, it is seen that a first preferred embodiment is illustrated. The modular system module 10 preferably has a foundation 20, a skeleton 90, a heat exchange assembly 110 and ductwork assembly 150. The foundation can be made of aluminum, steel or any other strong material without departing from the broad aspects of the present invention.

Turning now to FIG. 6, it is seen that the foundation 20 has end 21 and end 22, side 23 and side 24, top 25 and bottom 26. A first C shaped channel 30 is longitudinally at or along side 23, and a second C shaped channel 32 is longitudinally located at or along side 24. Several joists 35 perpendicularly span between the channels 30 and 32. Longitudinal passages 36 are formed in joists 35. The passages 36 allow for wires, piping or other items to run under the floor (described below). Two transport structures, particularly, fork pockets 38 and 39, respectively, can be provided and preferably run generally parallel to the C shaped channels 30 and 32. A fork lift can then be used to load and/or unload a module 10 or series of linked modules from a container or location. It is appreciated that rails on the bottom of the foundation aid in sliding of the module relative the ground or container bottom. Also, bolts or other fasteners may be used to secure the foundation to the ground or container bottom.

Floor sections 40, 41 and 42 can be provided. Each floor section has a top and a bottom. It is understood that the floor sections can have holes there through. The floor sections 40, 41 and 42 preferably are removably positionable over the passages 36 in the joists 35. In this regard, a worker can remove the desired floor panel to access any and all items below the panel. The holes allow any moisture, liquid, dirt or other relatively small item to pass through the holes to move to a location remote from the equipment. A stationary floor section 45 is also provided and is preferably centrally located within the foundation 20. Several lateral openings 46 extend through the stationary floor section 45.

Figure 9:
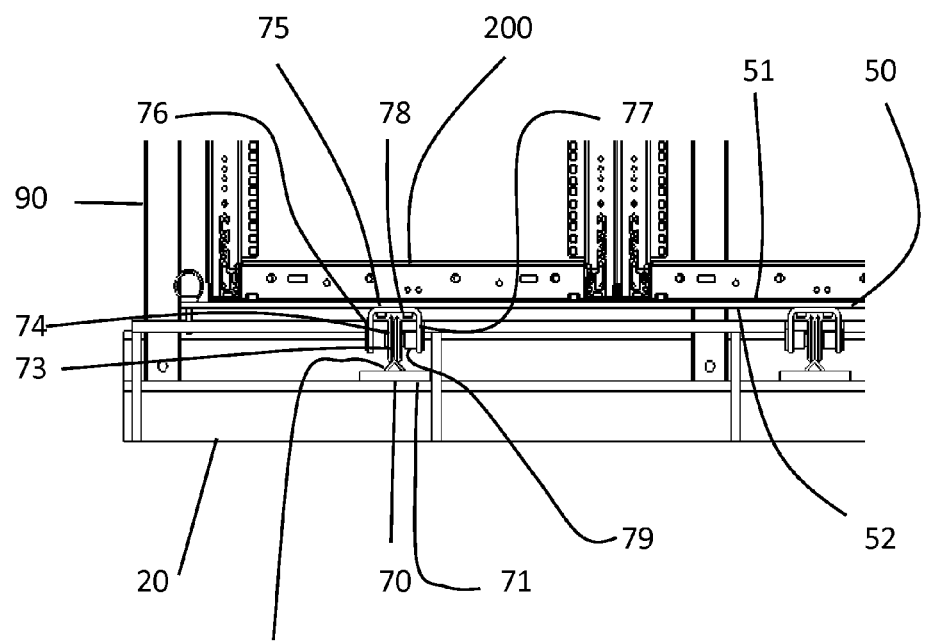
FIG. 9 is a side view without a C channel showing a preferred embodiment of the translation assembly of the present invention.

Staying with FIG. 6 and also looking at FIGS. 7 and 9, it is seen that a load bearing plate or bearing surface 50 having a top 51 and a bottom 52 is further provided. The bearing plate 50 is preferably located intermediate two strips of floor sections. However, it is understood that in alternative embodiments, such as a three aisle configuration, could be provided without departing from the broadest aspects of the present invention. It is understood that a three aisle configuration can have two independent bearing plates.

Figure 10:
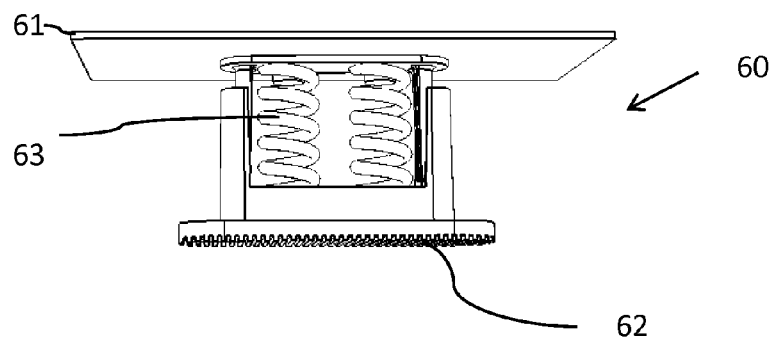
FIG. 10 is a perspective view of a preferred embodiment of an isolator of the present invention.
Figure 11:
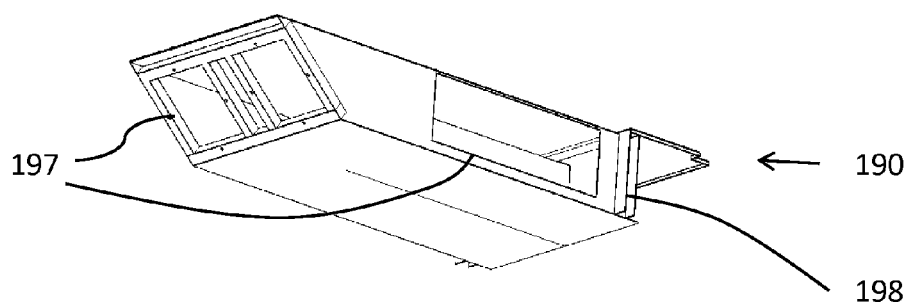
FIG. 11 is a first perspective view of preferred embodiment of the collector of the present invention.
Figure 12:
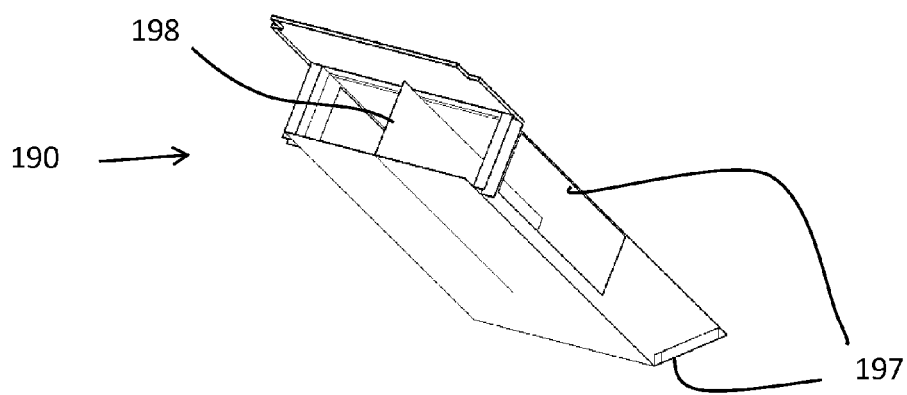
FIG. 12 is a second perspective view of a preferred embodiment of the collector of the present invention.

Turning now to FIGS. 1 and 10, a preferred embodiment of isolators 60 is shown. Each isolator 60 has a top 61, a bottom 62 and is comprised of a pair of coil springs. The springs 63 each have a longitudinal axis that is preferably oriented generally vertically and are located within the foundation 20. The isolators 60 preferably mechanically isolate the bearing plate 50 from shocks and vibrations impacting the foundation 20.

Figure 18:
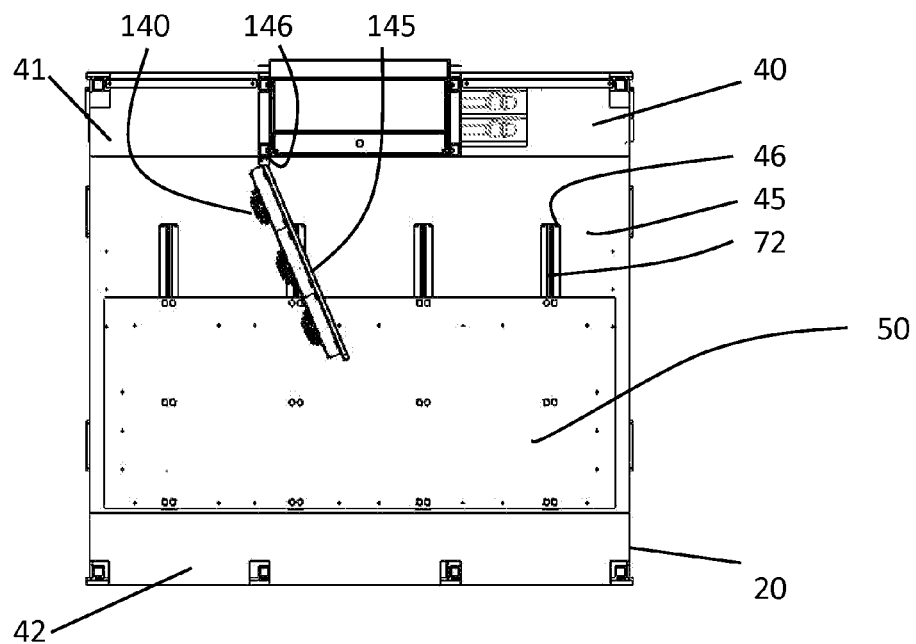
FIG. 18 is a top view showing a hinged panel swung to an open position providing access behind the panel.

Now looking at FIGS. 1, 9 and 18, it is seen that a translation assembly 70 is provided. The translation assembly 70 has a base 71, a track 72, rollers 73 with inverted V-shaped perimeters 74, a carrier 75 and a pin 79. The track is preferably linear, and generally has a converging shape similar to an inverted V. One or more rollers 73 are guided by and roll on the track 72. The rollers 73 have a perimeter 74 that are shaped to mate with the track to maintain linear tracking and stability. The carrier 75 can have a first vertical section 76 and a second vertical section 77, and a horizontal section 78 between the vertical sections. The vertical sections are preferably generally parallel to each other, and are preferably generally perpendicular to the horizontal section. The carrier 75 is preferably connected to the rollers 73 with pins 79. In a preferred embodiment, three rollers 73 are used. However, it is understood that more or fewer rollers can be used without departing from the broad aspects of the present invention.

The horizontal section 78 of the carrier 75 fits within and extends through the openings 46 in floor section 45. The openings 46 are wider than the carrier 75, wherein the carrier can move, or translate, within the opening. The horizontal sections 78 are connected to the bottom 52 of the bearing plate 50 wherein the bearing plate is movable relative the foundation 20.

Comparing FIGS. 6 and 7, it is seen that the bearing plate 50 is translated between a first position and a second position relative to the foundation 20. The translation assembly allows the operator to selectably access items in the module on both sides of the bearing plate 50. It is appreciated that the operation of the translation assembly can be manual or automated.

Turning now to FIGS. 3, 4, 6 and 7 in particular, a preferred skeleton 90 is illustrated. Skeleton 90 is preferably comprised of several uprights 91, each having a top 92 and a bottom 93. The uprights 91 are preferably generally parallel to each other and perpendicular to the C shaped channels 30 and 32. Cross members 95 are also provided. The cross members 95 each have ends 96 and 97, respectively, and are preferably generally parallel to each other perpendicular to the uprights 91. The cross members 95 can comprise angle members with a vertical section and horizontal sections. The cross members 95 can be arranged in pairs having opposing inward facing horizontal sections that support ductwork boxes (described below). Wiring and other items may be routed through conduit 98.

Figure 3:
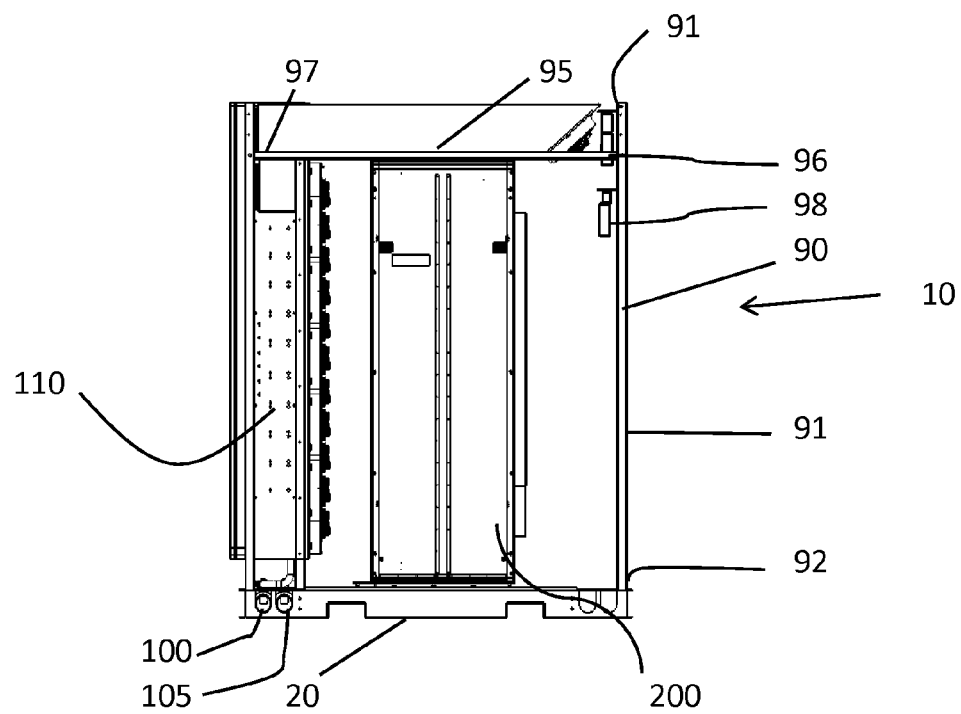
FIG. 3 is an end view of the preferred embodiment of the present invention shown in FIG. 1.
Figure 4:
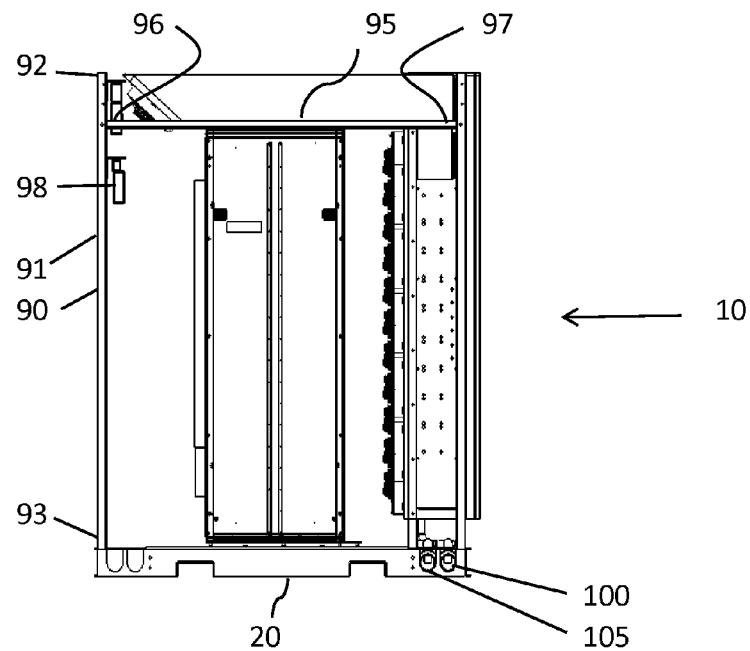
FIG. 4 is an opposite end view (compared to FIG. 3) of the preferred embodiment of the present invention shown in FIG. 1.
Figure 5:
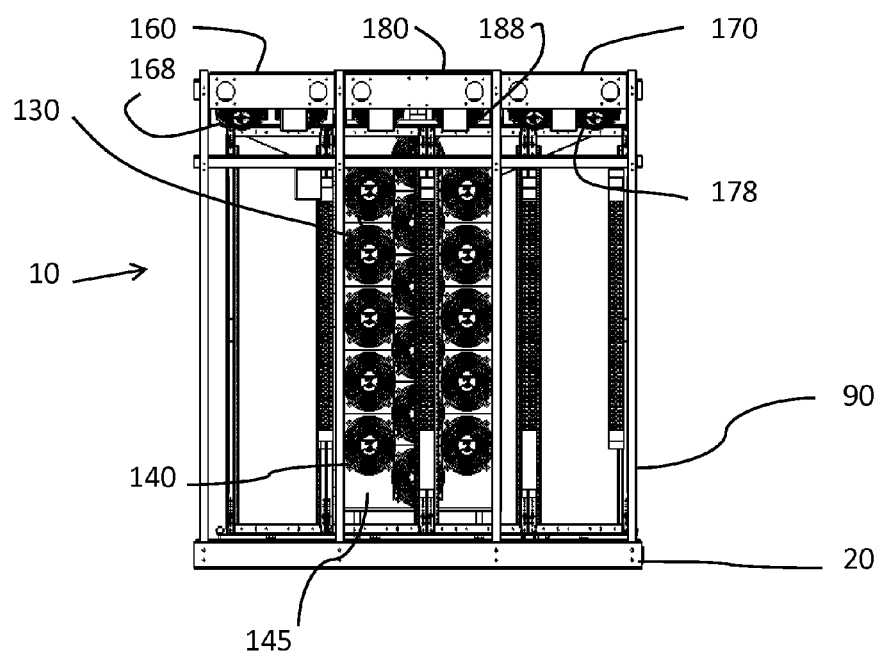
FIG. 5 is an opposite side view (compared to FIG. 2) of the preferred embodiment of the present invention shown in FIG. 1.

Piping 100 and 105, such as tubes or lines, are provided and can best be seen in FIGS. 1, 3 and 4. The piping can contain hydraulics, water, coolant, or other gasses or fluids which can be used as a cooling medium or material for the heat exchanger. The piping can be used for other reasons as well. The piping 100 and 105, as illustrated, can be routed through the passages 36 formed by the joists 35 under the removable floor sections 40 and 41. Any leaks will be contained below the floor 40, 41 and 42 and remote from the equipment.

Looking now at FIGS. 2, 5, 7 and 8 in particular, it is seen that a preferred heat exchanger assembly 110 is provided. The heat exchanger assembly 110 can have a plenum 120, a heat exchanger 130, one or more fans 140 and one or more panels 145. It is understood that the location of the heat exchanger assembly is preferably on the side of a module 10, allowing for easy plumbing and servicing.

Plenum 120 has a top 121 and a bottom 122, a side 123 and a second side 124, a first wall 125 and a second wall 126. The first wall is preferably on the inner side of the assembly 110, and the second wall 126 is preferably on the outer wall of the assembly. The plenum 120 houses the heat exchanger 130 and also collects any condensate material.

Figure 8:
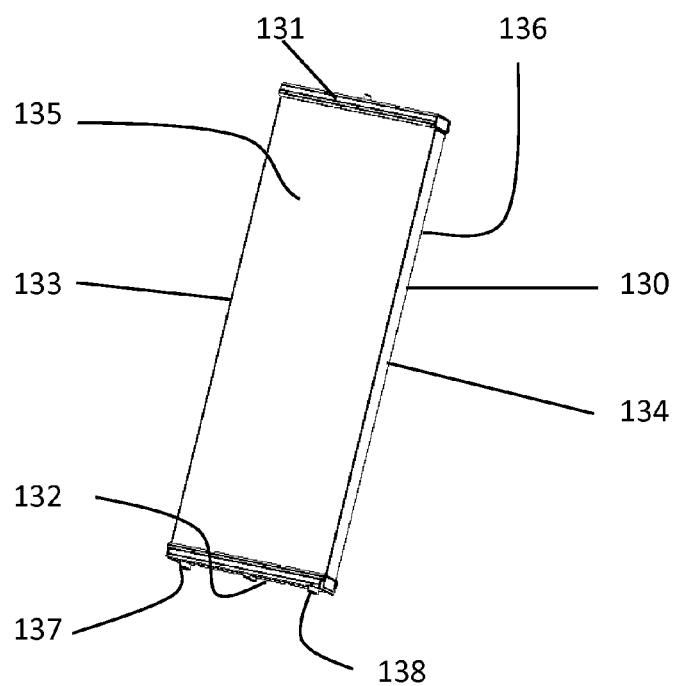
FIG. 8 is a perspective view of a preferred heat exchanger of the present invention.

Now turning to FIG. 8, it is seen that the heat exchanger 130 has a top 131, a bottom 132, a first side 133, a second side 134 a front 135 and a back 136. An inlet 137 and an outlet 138 are provided. Both the inlet 137 and the outlet 138 can be located at the bottom 132 of the heat exchanger 130. In this regard, the heat exchanger can preferably have a front section wherein the coolant moves upward, and a rear section wherein the coolant moves downward. In this regard, the air moving across the heat exchanger passes through both the front section and the rear section. Of course, more than one heat exchanger may be utilized without departing from the broad aspects of the present invention. Also, the heat exchanger may be configured differently, such as a horizontal heat exchanger with fittings located generally at the heat exchanger ends without departing from the broad aspects of the present invention.

Fans 140 are provided, as are panels 145 as illustrated in FIGS. 7 and 8. While fans are illustrated, it is understood that any suitable type of air mover may be utilized without departing from the broad aspects of the present invention. The panel 145 is preferably hinged with a hinge 146 for allowing access behind the panel 145. It is understood that louvers or diffusers could be incorporated adjacent the fans to direct the air as it leaves the heat exchanger assembly 110.

Figure 2:
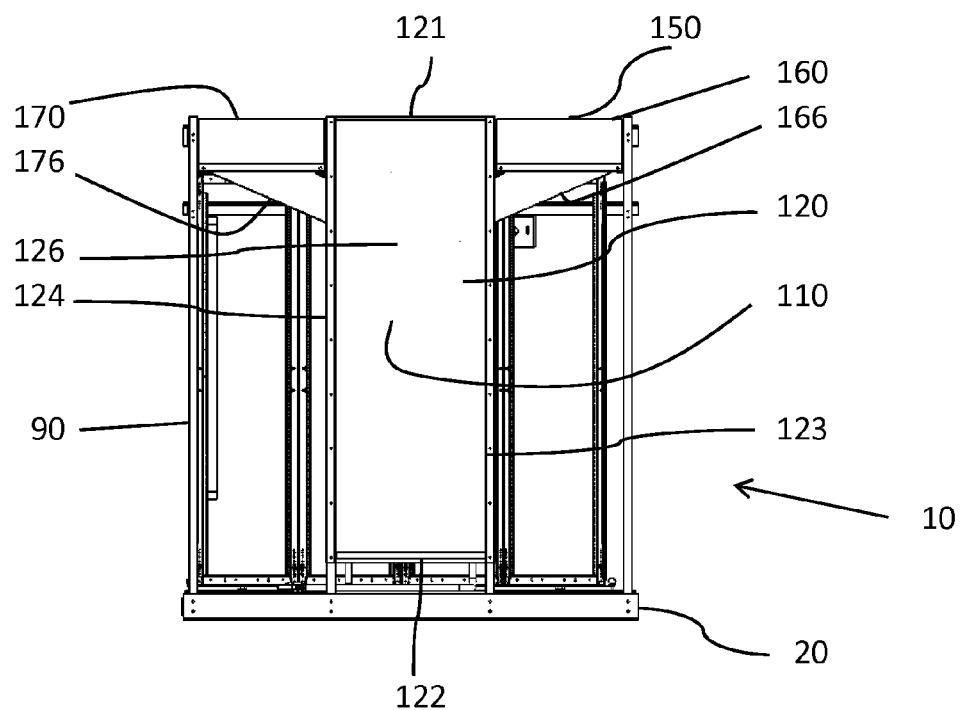
FIG. 2 is a side view of the preferred embodiment of the present invention shown in FIG. 1.

Turning now back to FIGS. 1 and 2, it is seen that a ductwork or ducting assembly 150 is provided. The ducting assembly 150 has several boxes 160, 170 and 180, as well as a collector 190. The ducting is preferably integrated into the perimeter of the system or module 10. Each box can define a channel. It is understood that more or less than channels may be used without departing from the broad aspects of the present invention. It is appreciated that the ducting intakes, described below, are at the top of the module 10 to take advantage of the natural buoyancy of the warmed air.

Box 160 has a first end and a second end, and a first side and a second side. An inlet 165 is at the first end and an outlet 166 is at the second end. Further, a crossover outlet is near the second end and directs a portion of the air to enter the center box 180. Box 160 further has a top panel and a bottom panel, and generally has a rectangular cross-section. The top and the bottom panels can be transparent, such that light can pass there through. A fan 168 or other type of air mover can force air into the inlet 165.

Box 170 has a first end and a second end, and a first side and a second side. An inlet 175 is at the first end and an outlet 176 is at the second end. Further, a crossover outlet is near the second end and directs a portion of the air to enter the center box 180. Box 170 further has a top panel and a bottom panel, and generally has a rectangular cross-section. The top and the bottom panels can be transparent, such that light can pass there through. A fan 178 or other type of air mover can force air into the inlet 175.

Box 180 has a first end and a second end, and a first side and a second side, and is preferably located between box 160 and box 180. An inlet 185 is at the first end and an outlet. Further, crossover inlets are near the second end and receive a portion of the air exiting crossover outlets 166 and 176 of boxes 160 and 170 respectively. Box 180 further has a top panel and a bottom panel, and generally has a rectangular cross-section. The top and the bottom panels can be transparent, such that light can pass there through. A fan 188 or other type of air mover can force air into the inlet 185.

Now looking at FIGS. 1, 2, 11 and 12, it is seen that a collector 190 is provided for collecting the air from the boxes 160, 170 and 180. The collector 190 has a top, a bottom, sides, and ends. Inlets 197 are provided for collecting air as it passes through outlets 166 and 176 of boxes 160 and 170, respectively and also through outlet recessed within box 180. A single outlet 198 is preferably provided, and discharges the air into the top 121 of the plenum 120.

An equipment rack 200 can be positioned upon the bearing plate 50, as seen in FIGS. 1, 3-5, 16 and 17. The rack 200 can have sides, a front 201 and a back 202. One type of rack is a server rack. However, it is appreciated that other types of racks for other types of equipment needing to be cooled can be used without departing from the broad aspects of the present invention. It is appreciated that while an equipment rack is illustrated, it is not intended to be limiting in any way. Any cabinet or other structure may be utilized without departing from the broad aspects of the present invention. It is further appreciated that the broad aspects of the present invention are applicable even in embodiments without a traditional rack.

Figure 17:
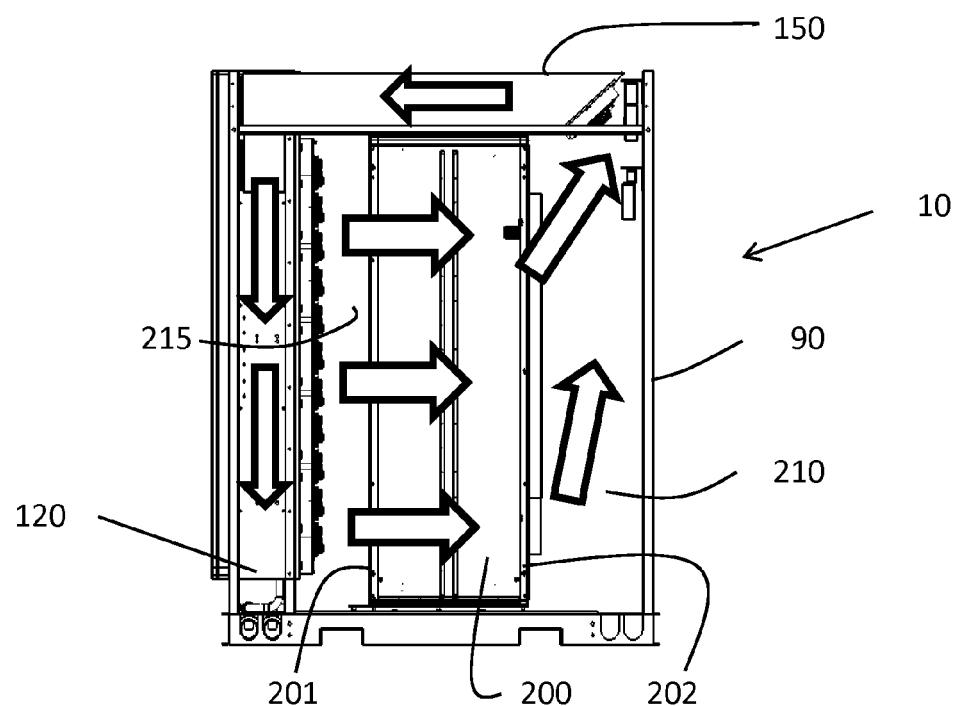
FIG. 17 is an end view showing air recirculating through a module after passing through a heat exchanger.

Turning now to the air flow of the illustrated preferred embodiment, and looking at FIG. 17, the arrows depict a stratified air flow (cool low, hot high). The air enters the cool aisle 215 and passes through the equipment rack 200. In an embodiment where servers are cooled, the existing fans on board the servers or other equipment can, but need not, help move the air across the equipment. In this regard, the fans 140 of the present invention can provide sufficient air flow to keep any equipment within the modules cool. The air gains heat from the equipment and then enters the hot aisle 210. The buoyancy of the warmer air tends to cause it to rise. Fans 168, 178 and 188 assist, pull or direct the air into the ducting assembly 150, where it passes through boxes 160, 170 and 180, and into the collector 190. The air enters the plenum 120 and passes through the heat exchanger 130 to cool before passing through fans 140 and back into the cool aisle 215.

Figure 16:
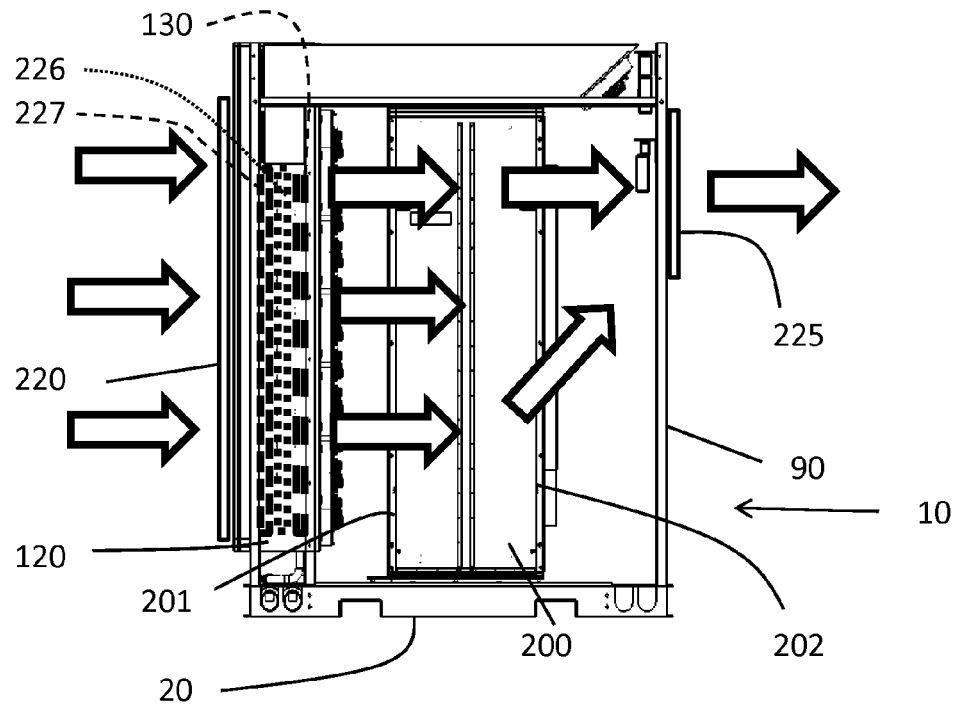
FIG. 16 is an end view showing environmental air entering through an intake and exiting through an exhaust.

Looking now at FIG. 16, it is seen that an embodiment drawing external environmental air through the module 10 is illustrated. A fresh air intake 220 with a filter is provided and an exhaust 225 to the environment is provided. The fresh air enters into the cold aisle 215, passes through the equipment, enters the hot aisle 210, and then exits through exhaust 225. Environmental conditions can be used to the advantage of the operator when the ambient environmental air temperature is less than the air temperature after the air passes through the equipment held in the equipment rack. In this regard, the ambient environmental air would be cooler than the otherwise recirculated air, and would require less cooling (compared to the recirculated air) to achieve the desired cold aisle temperature.

It is understood that during operation, the operator can select either the flow shown in FIG. 16 or the flow shown in FIG. 17, or a combination of both. Staying with FIG. 16, it is seen that several distinct heat exchangers, including a direct cooling heat exchanger 130, a direct expansion heat exchanger 226 and an evaporative heat exchanger 227 can be housed within the plenum. Each of these heat exchangers can be independently used, or as an alternative, used in combination with filtered fresh ambient air. In this regard, a real time feedback control can be used to sense environmental conditions and make electro-mechanical adjustments to the system to direct the necessary flow paths to achieve the desired amount of heat dissipation.

Figure 19:
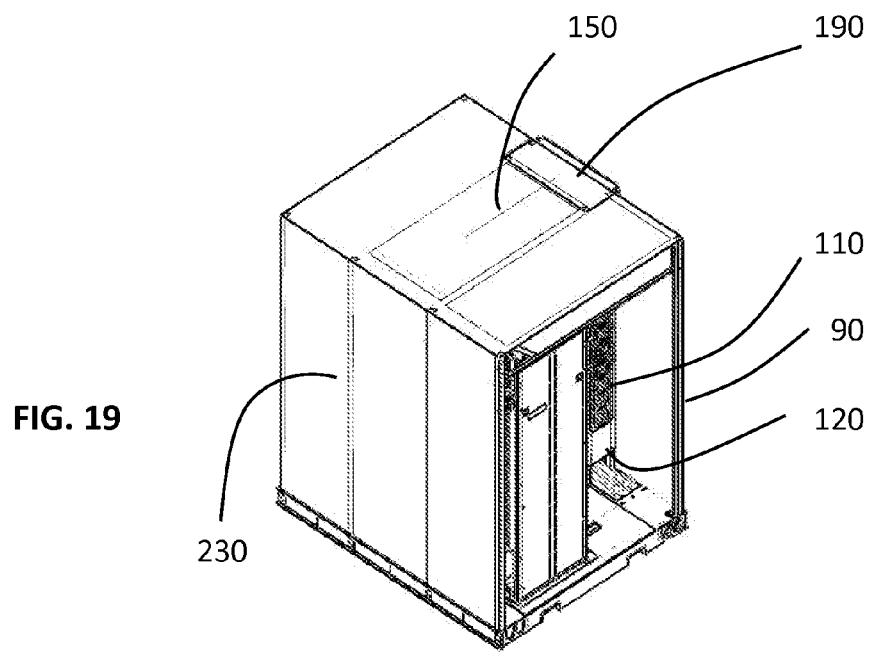
FIG. 19 is a perspective view of a preferred embodiment of the present invention showing insulation panels in place.

Looking now to FIG. 19, it is seen that walls 230 can be provided. The walls can contain insulation or material with other desirable attributes, namely noise reduction, protection from the elements and structural enhancement among others. The walls can be attached to or supported by the skeleton 90. One preferred method of removably attaching the walls or panels is with bolts. Walls can be used when the module 10 is intended for use as a stand-alone structure, as well as when the modules are scaled and housed in a container in order to act as a skin to maintain desired air flow characteristics.

Figure 13:
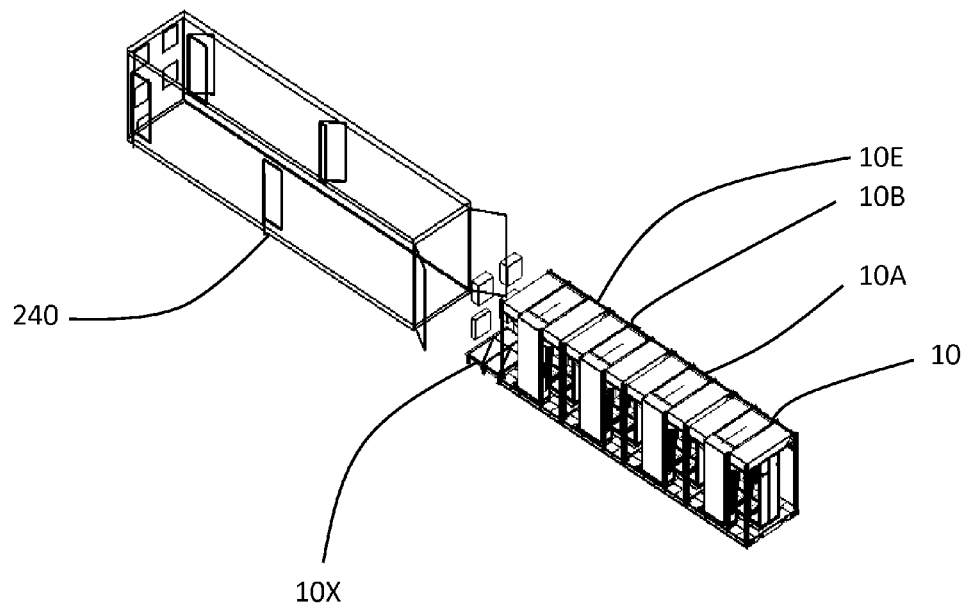
FIG. 13 is an exploded perspective view of one embodiment of the present invention showing several linked modules and a ½ module, each of which are external of a container.

Now turning to FIG. 13, it is seen how several modules can be assembled end to end to form a complete assembly. While bolts are a preferred connector, it is understood that other connectors may be used without departing from the broad aspects of the present invention. A ½ module 10X is shown to be longitudinally connected to modules 10, 10A, 10B, 10D and 10E. In this embodiment, an information technology pack is shown with several modular sever racks linked in an end to end relationship. The ½ module can be a utility module. The complete assembly is able to be moved into a container 240 with a transport assembly.

Figure 13A:
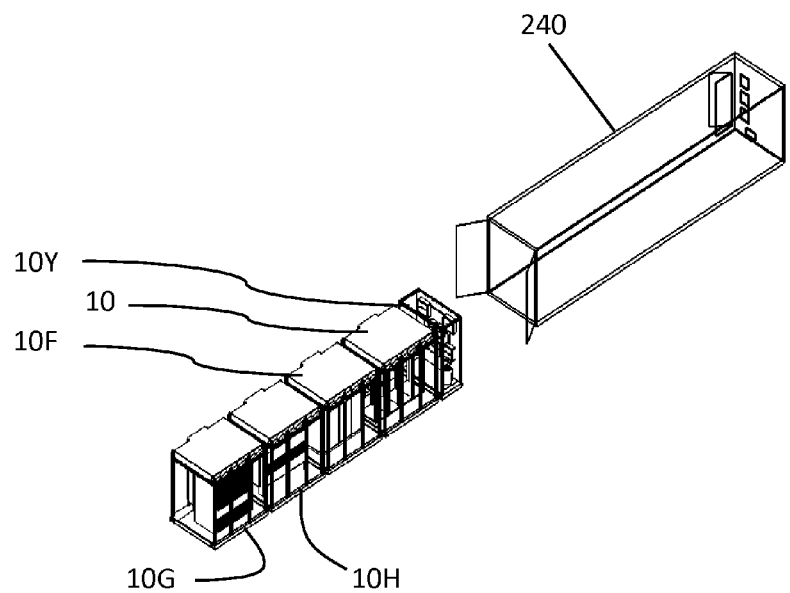
FIG. 13A is an exploded perspective view of an alternative embodiment of the present invention showing several linked modules and a ½ module, each of which are external of a container.

It is understood that modules of distinct purposes could be modularly connected to create solutions to alternative situations as well. As one example, and looking now to FIG. 13A, it is seen that modules 10, 10F, 10G, 10H and 10Y could be linked to form self-sufficient center processing having, an electronics equipment module, a power plant module, an HVAC or environmental control module, a backup power module and a utility module, respectively. The self-sufficient processing center is capable of operation independent of a permanent facility. Some examples of preferred centers are data centers, telecommunications centers and medical imaging centers.

During assembly, the equipment rack 200 may be installed and filled with equipment prior to the skeleton 90 being assembled. The equipment can be fully wired and operational prior to inserting the module 10 assembly into the container 240. Also, once put in location (either stand alone or within a container) a worker will have access to the equipment for service, replacement, removal and otherwise via both the hot aisle 210 and the cold aisle 215.

Figure 14:
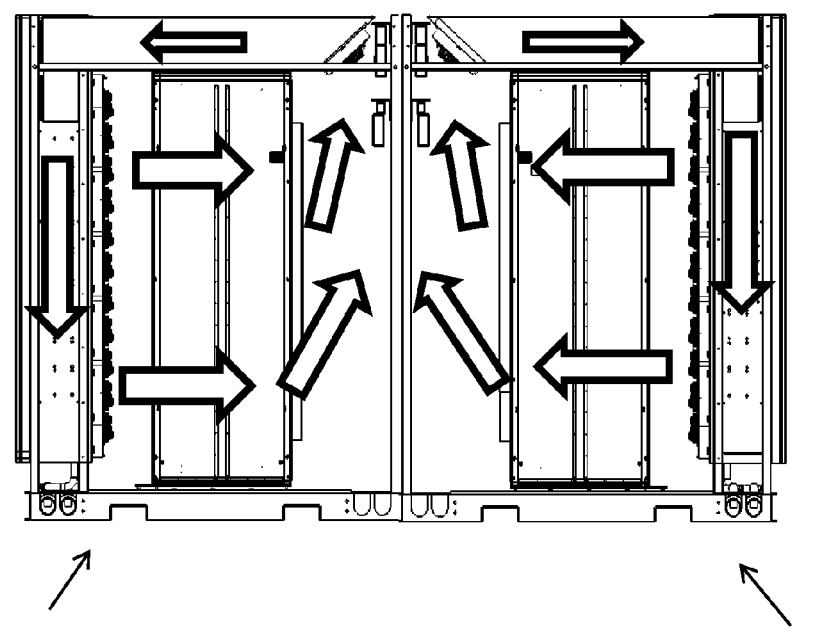
FIG. 14 is a side view of two modules in a side to side configuration wherein a single hot aisle is provided.

Looking now at FIG. 14, it is seen that an arrangement wherein two modules 10 and 10C are shown back to back. It is seen that the removably assembled modules comprise two cold aisles, and a single central hot aisle. Duplicate elements in such an arrangement are eliminated; as common elements such as walls and insulation can be removed from the respective module outer walls can be eliminated.

Figure 15:
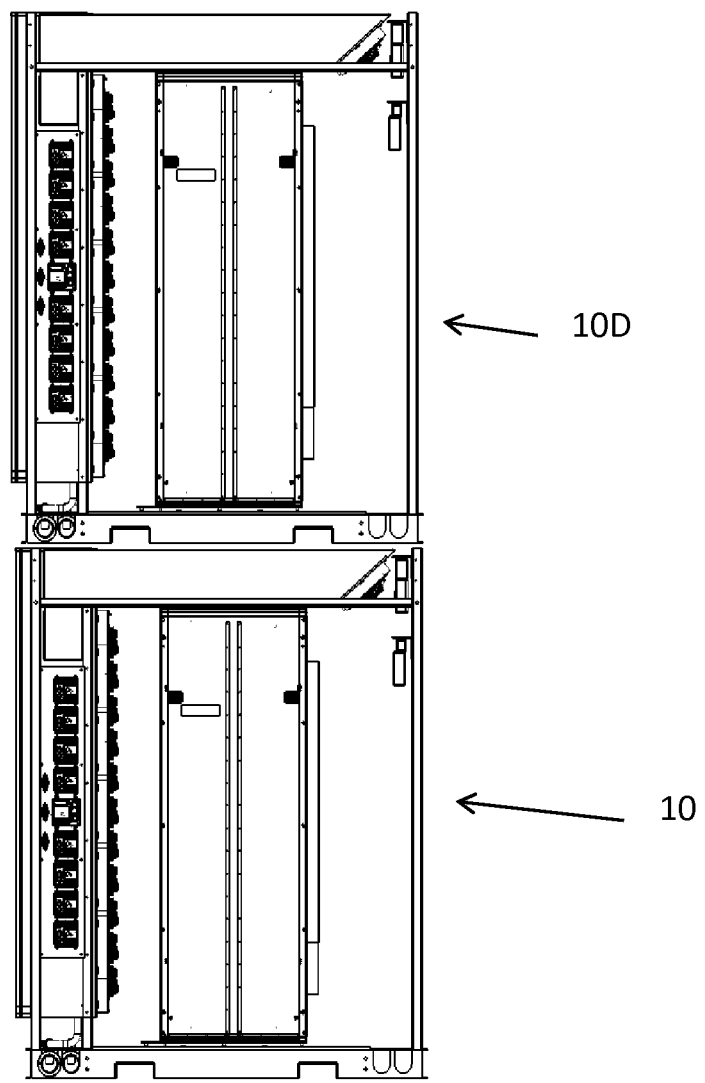
FIG. 15 is an end view of two modules in a vertically stacked configuration.

Looking now at FIG. 15, it is illustrated how two modules 10 and 10D are vertically stacked to increase density of equipment per square foot of the overall foot print.

Turning now to FIGS. 20-27, it is seen that an alternative preferred embodiment is illustrated. A module 310 having a foundation 320, a bearing plate 330, a translation assembly 340, a skeleton 350, a heat exchanger assembly 370 and a ductwork assembly 380 is provided. Each of these components is described in detail below. Module 310 is similar to module 10 described above in many respects, and is different in other respects. Some of the distinct features of module 310 are described below.

The foundation 320 has a first end 321 and a second end 322, a first side 323 and a second side 324, a top 325 and a bottom 326. The top of the foundation 320 can comprise a floor 327 with several lateral openings 328 there through.

Figure 20:
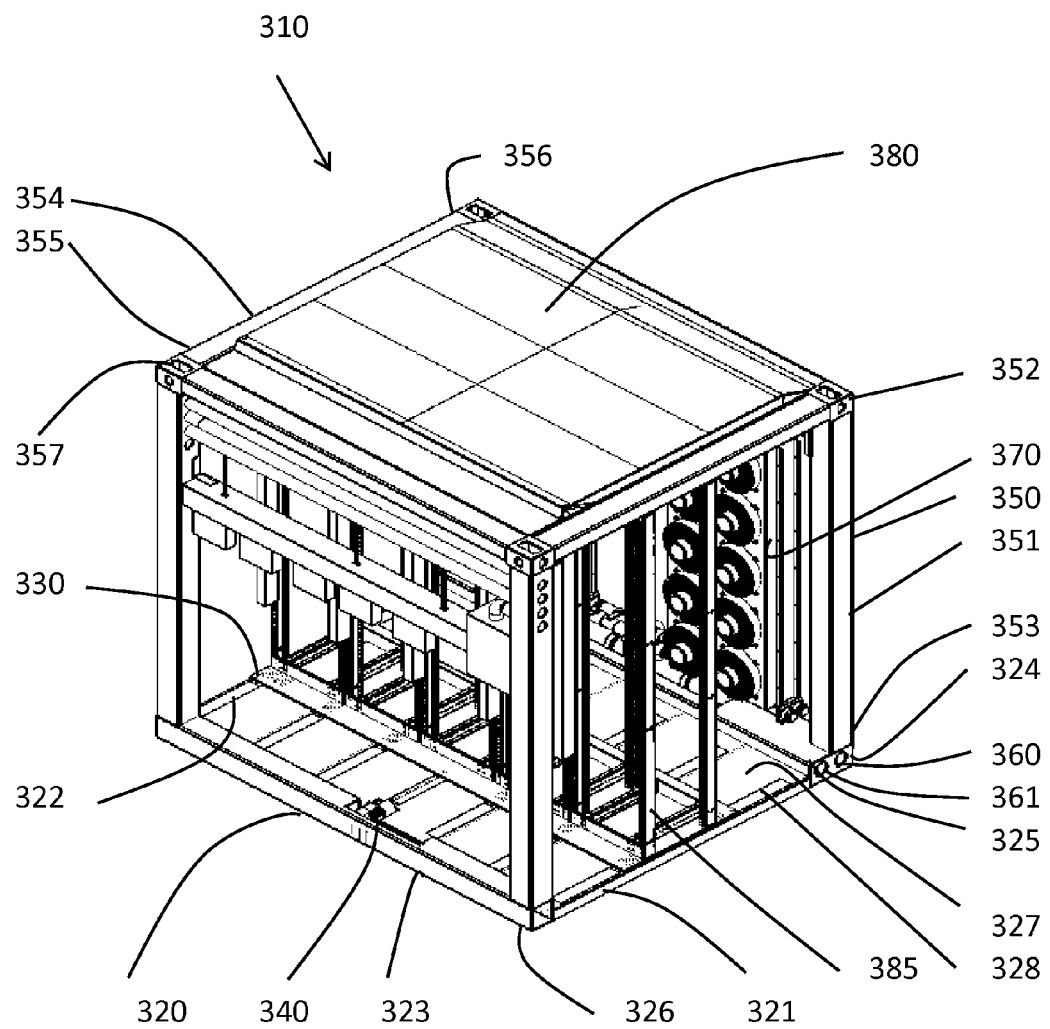
FIG. 20 is a perspective view of an alternative preferred embodiment of the present invention.
Figure 21:
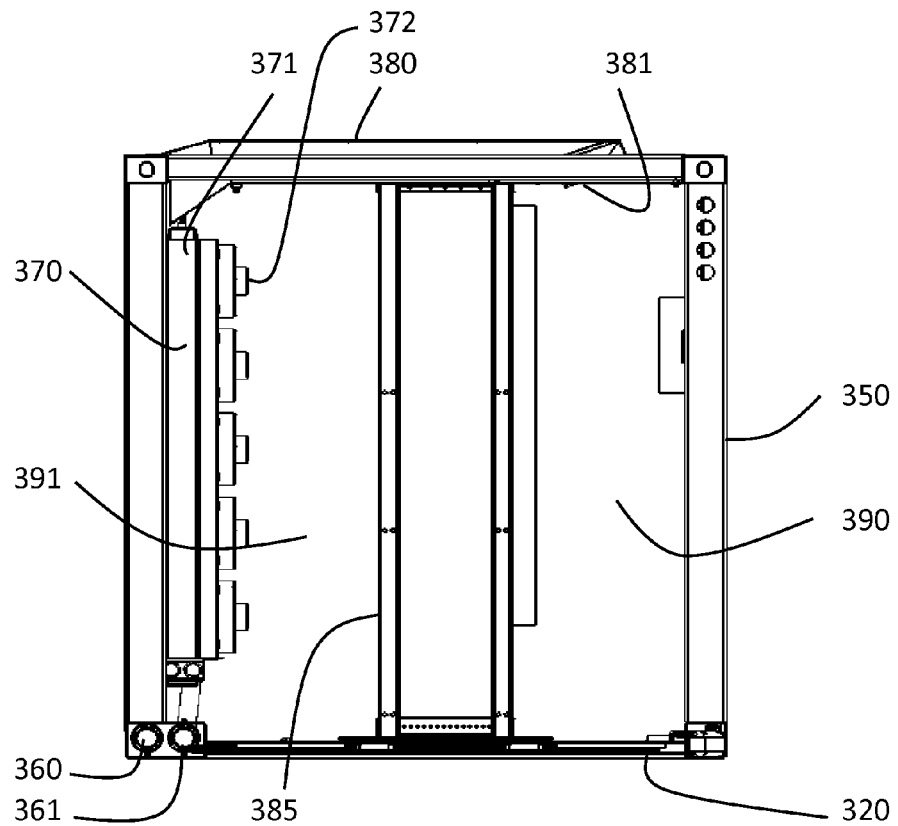
FIG. 21 is an end view of the preferred embodiment of the present invention shown in FIG. 20.

A bearing plate 330 is provided and is atop the floor 327, as seen in FIGS. 20 and 21. The bearing plate 330 has a top 331 and a bottom 332. An equipment rack 385 is stationarily fixed on the bearing plate 330.

Figure 23:
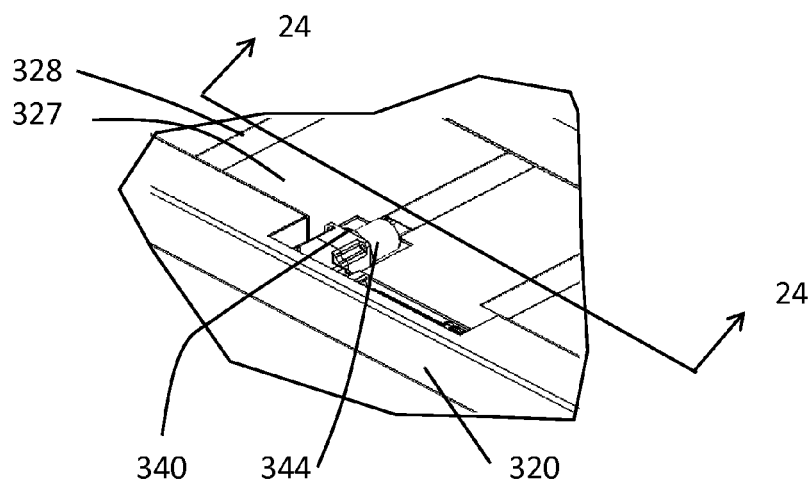
FIG. 23 is a close up perspective view of the preferred embodiment shown in FIG. 20 illustrating a translation assembly.
Figure 24:
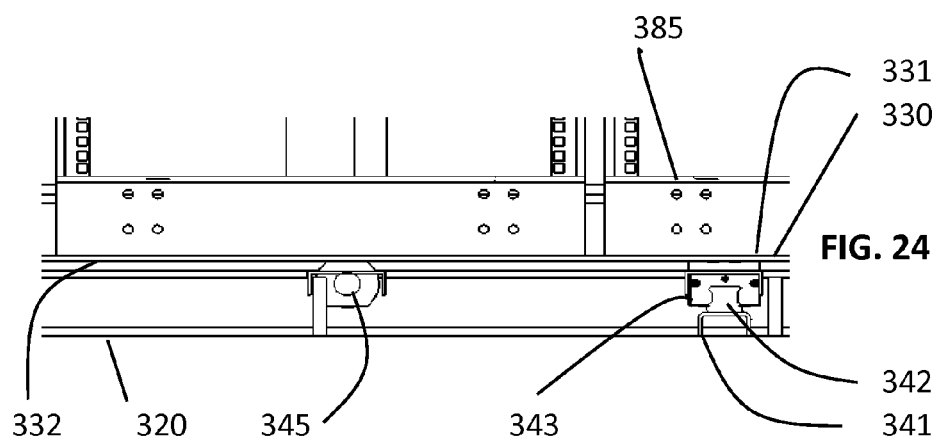
FIG. 24 is a cross-sectional view taken along line 24-24 in FIG. 23.
Figure 25:
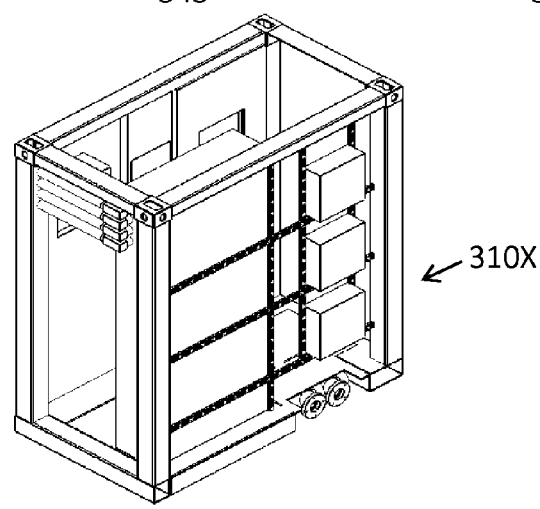
FIG. 25 is a perspective view of a ½ module.

Looking now to FIGS. 20, 23 and 24, it is seen that an automated translation assembly 340 is provided. The translation assembly 340 has a base 341 having a track or rail 342. The track 342 is preferably linear. A carrier 343 has a top connected to the bottom 332 of the bearing plate 330. The bottom of the carrier 343 mates with the exterior of the rail 342. A drive 344 drives a shaft 345 that selectably moves the carrier towards and away from the drive 344. In this regard, the equipment rack 385 can be selectively laterally moved within the module 310.

Skeleton 350 has uprights 351, each having a top 352 and a bottom 353. There is an upright 351 at each corner of the foundation 320. Cross members 354 having ends 355 and 356 span between the uprights. A lift anchor 357 is at the top of each of the corner uprights 351. A lift lug (not shown) can be inserted into each lift anchor 357 via a turn and lock assembly, wherein a four point lift can transport the module to an intended destination. While lift anchors are shown, it is appreciated that alternative transport structures may be employed without departing from the broad aspects of the present invention.

Piping 360 and 361 are provided and connected to a heat exchanger assembly 370. The heat exchanger assembly has a plenum 371, a heat exchanger and fans 372. The heat exchanger assembly is preferably located on a side of and supported by the skeleton 350 of the module 310. The fans 372 draw the air across the heat exchanger and into a cold aisle 391.

Figure 26:
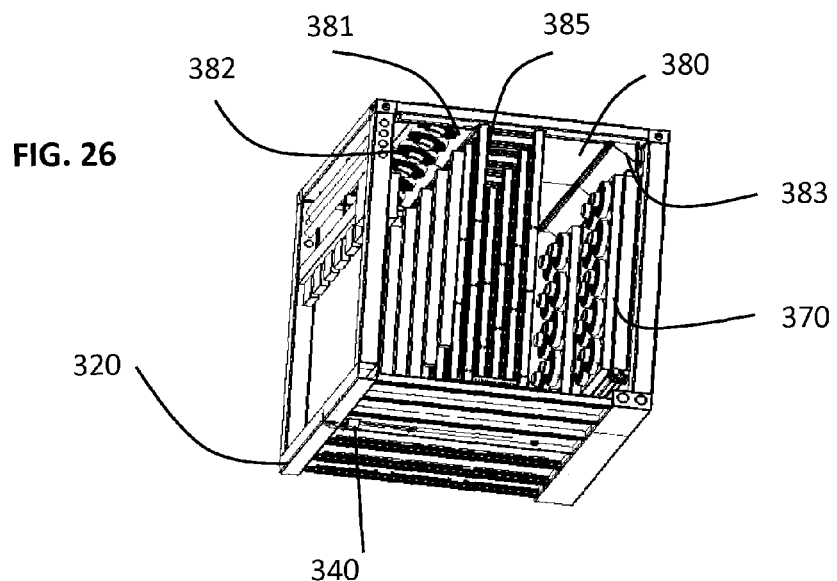
FIG. 26 is a bottom perspective view of the preferred embodiment shown in FIG. 20.

A ductwork assembly 380 is further provided, as best shown in FIGS. 20, 21 and 26. The ductwork assembly 380 has an inlet 381 and an outlet 383. Fans 384 are preferably provided for drawing air from a hot aisle 390 and into the inlet 381. The air exits the outlet and enters the plenum 371. As seen best in FIG. 21, the top of the ductwork can extend above the cross members 354 of the skeleton to increase the interior height within the module 310.

Figure 22:
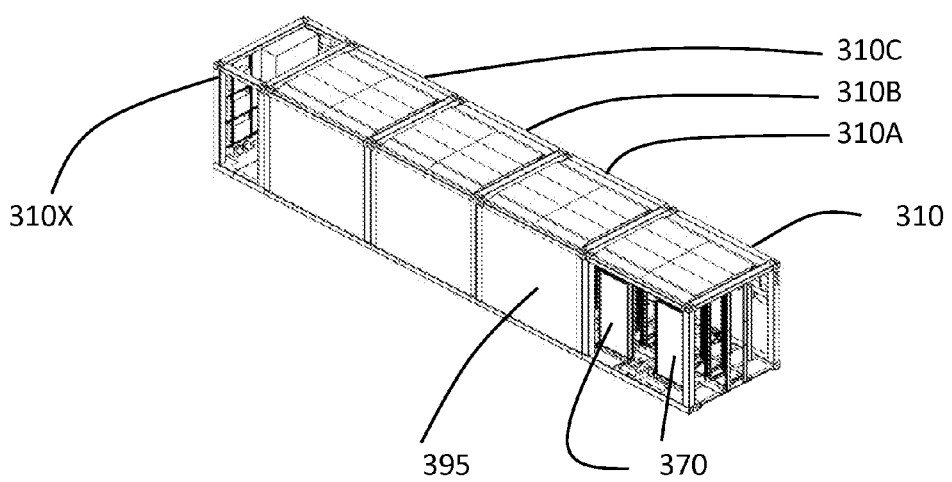
FIG. 22 is a perspective view of several linked modules of the preferred embodiment illustrated in FIG. 20 shown in a sheathed configuration.

Turning now to FIG. 22, a sheath 395 is shown.

Figure 27:
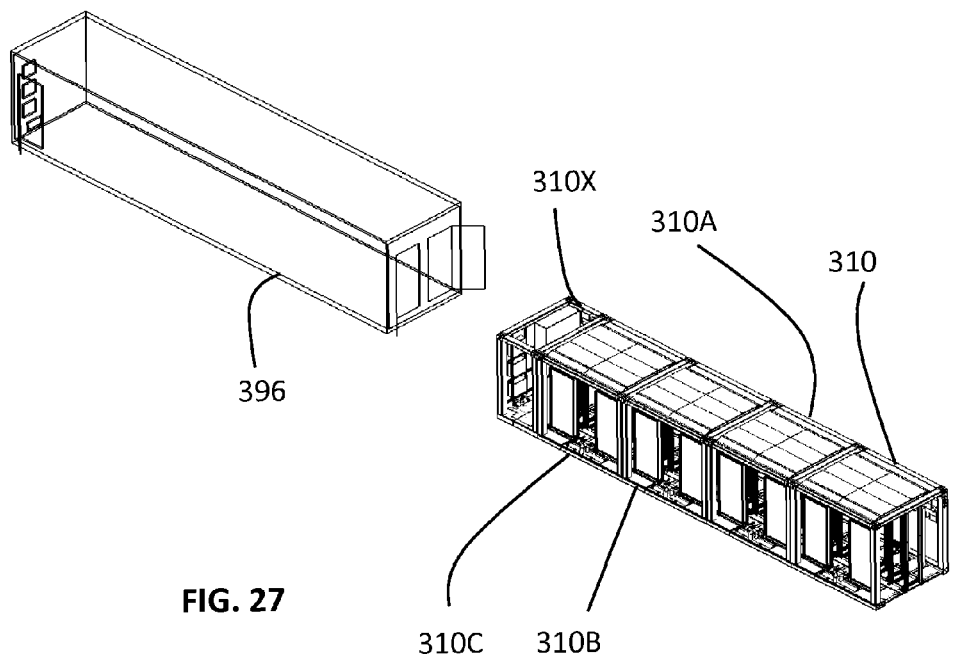
FIG. 27 is an exploded perspective view of an embodiment of the present invention showing several linked modules and a ½ module, each of which are external of a container.
Figure 28:
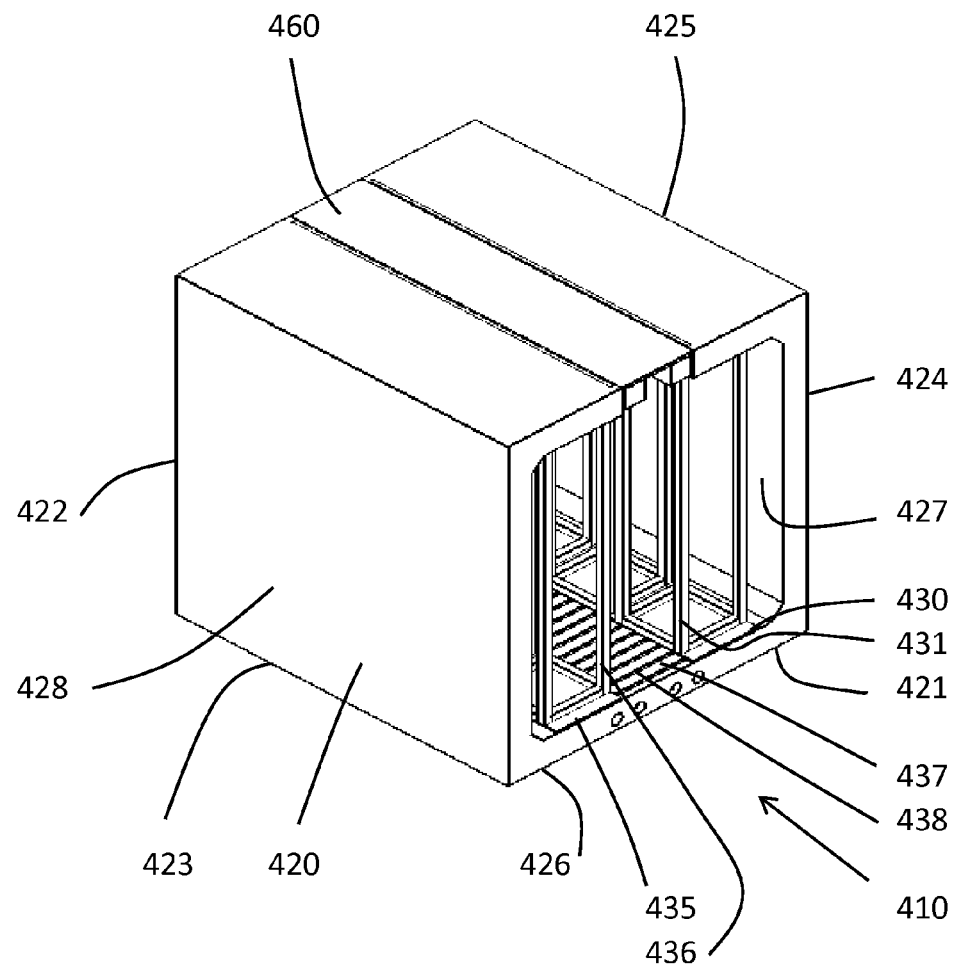
FIG. 28 is a perspective view of an alternative embodiment of the present invention.

Alternatively, as seen in FIG. 27, several linked modules 310, 310A, 310B, 310C and 310X can be configured for insertion in a container 396. Module 310X is a ½ module, and is shown in isolation in FIG. 25. The ½ module can be used as a utility module.

Turning now to FIGS. 28-31, it is seen that an additional alternative embodiment of the present invention is illustrated. Module 410 is provided having a walled structure 420, bearing plates 430 and 435 and ducting 440. Each of these components is described below.

Walled structure 420 has a first end 421 and a second end 422, a first side 423 and a second side 424, and a top 425 and a bottom 426. Walled structure has a generally rectangular cross-sectional dimension. The walled structure further has an inner wall 427 and an outer wall 428.

A first bearing plate 430 supports a first equipment rack 431. The bearing plate 430 is spaced a selected distance interior of the first side 423 of the walled structure. A second bearing plate 435 supports a second equipment rack 436. Bearing plate 435 is spaced a selected distance interior of the second side 424 of the walled structure. The first bearing plate 430 and second bearing plate 435 are parallel to each other and are separated by separation surface 437. Separation surface has several lateral openings 438 there through.

Ducting 440 is defined as the interior of the walled structure 420 between the inner wall 427 and the outer wall 428. In this regard, the walled structure or wall forms the ducting. A ducting first side 441 is within the first side 423 of the walled structure, and a ducting second side 442 is within the second side 424 of the walled structure. The ducting has a top 443 and a bottom 444. Intakes 450 are at the top of the ducting. A single return 451 is provided preferably centrally at the bottom 444 of the ducting 440. It is appreciated that while not specifically illustrated, that a heat exchanger and a fan are preferably located within each side 441 and 442 of the ducting 440 to cool and move the air within the first side 441 and second side 442 of the ducting, respectfully. The heat exchangers are segregated from the equipment within the equipment racks.

A cross-over conduit structure 460 is provided and is centrally located within the top 443 of the walled structure 420.

Figures 29, 30:
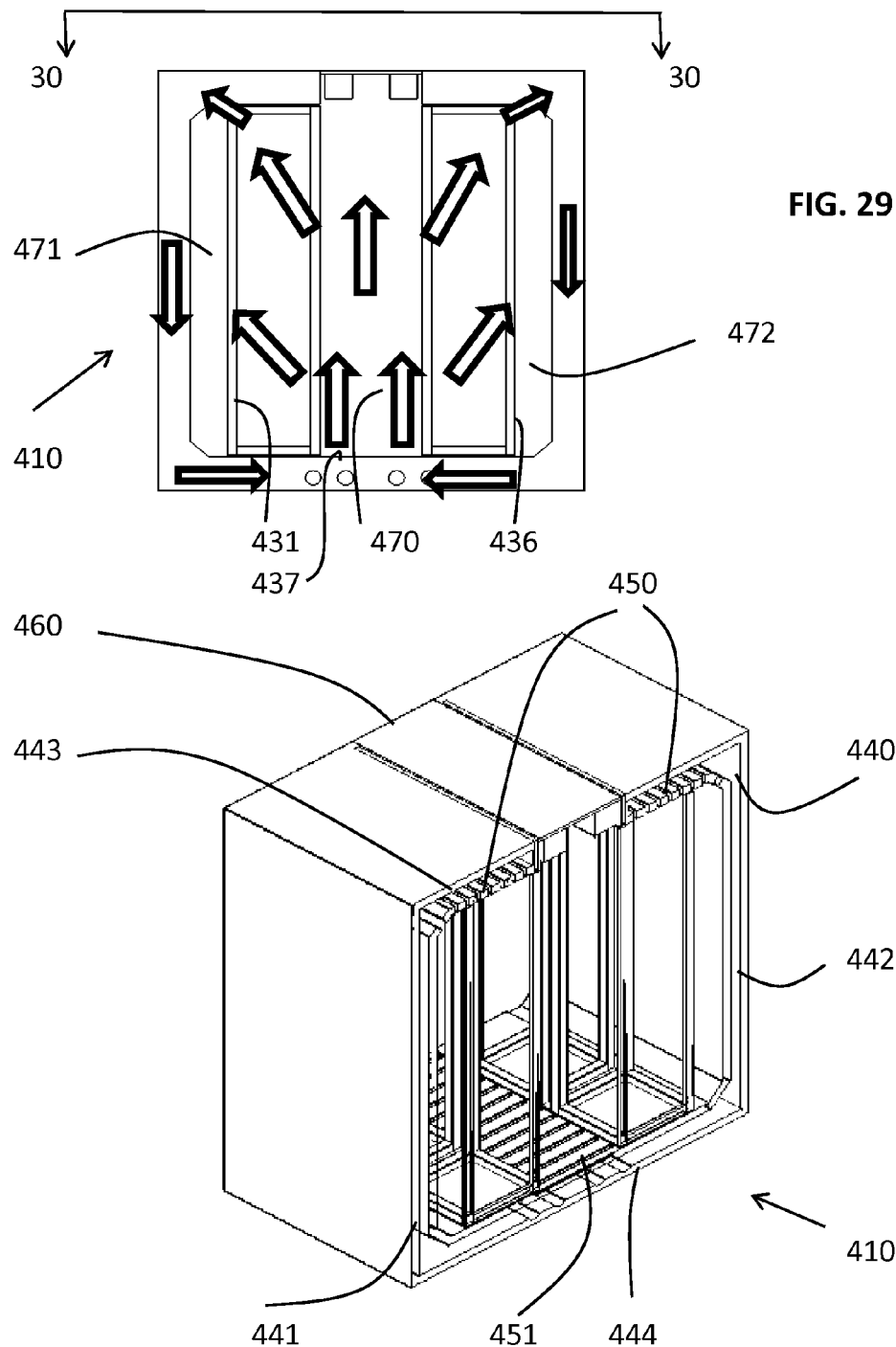
FIG. 29 is an end view of the preferred embodiment shown in FIG. 28.
FIG. 30 is a cross-sectional view taken along line 30-30 in FIG. 29.

As seen in FIG. 29, a single cold aisle 470, and two opposed hot aisles 471 and 472 are provided. In this regard, a hot aisle/cold aisle/hot aisle configuration is provided within a single robust structure.

Figure 31:
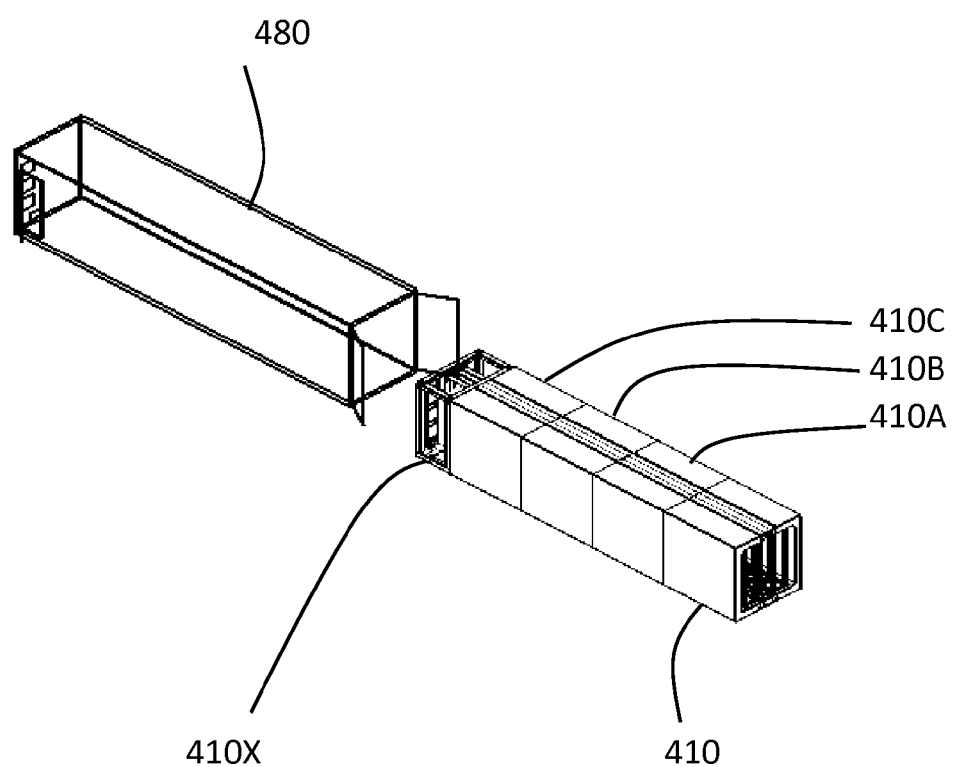
FIG. 31 is an exploded perspective view of an embodiment of the present invention showing several linked modules and a ½ module, each of which are external of a container.

It is appreciated that the bearing plates may be translating surfaces or stationary surfaces without departing from the broad aspects of the present invention. Further, it is appreciated that one of several types of transport structures may be used to move the module 410 to an intended destination. As seen in FIG. 31, one such destination for a series of longitudinally linked modules 410, 410A, 410B, 410C and 410X is a container 480. Of course, many other types of containers may be used without departing from the broad aspects of the present invention. Modules can also be placed in a vertically stacked arrangement.

Figure 32:
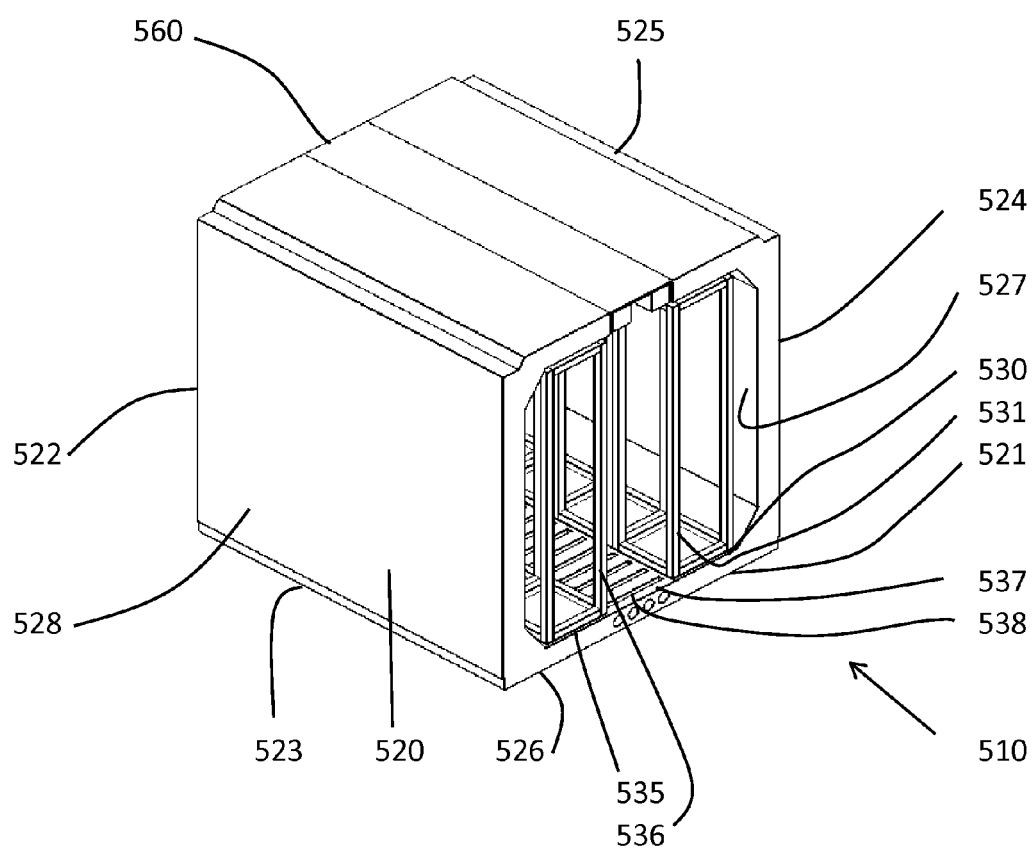
FIG. 32 is a perspective view of an alternative embodiment of the present invention.
Figure 33:
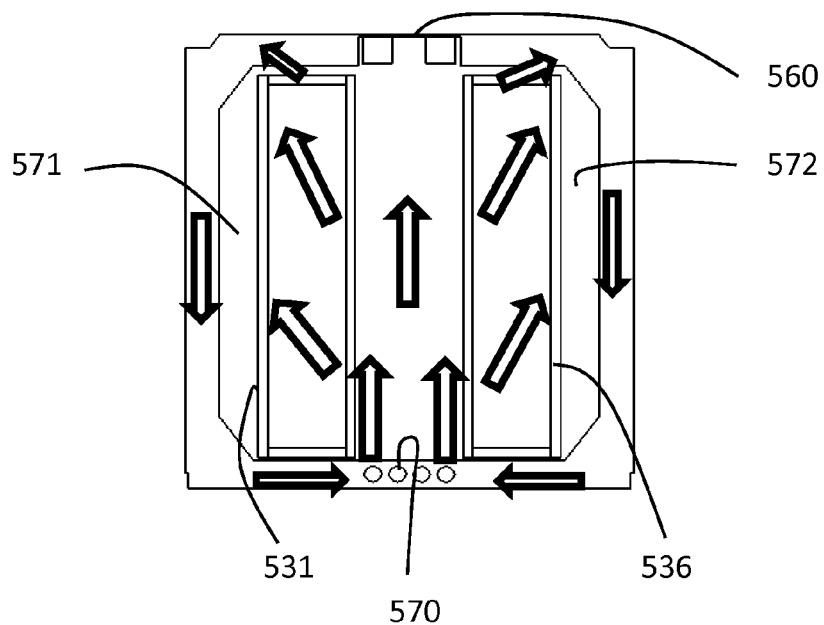
FIG. 33 is an end view of the preferred embodiment shown in FIG. 32.
Figure 34:
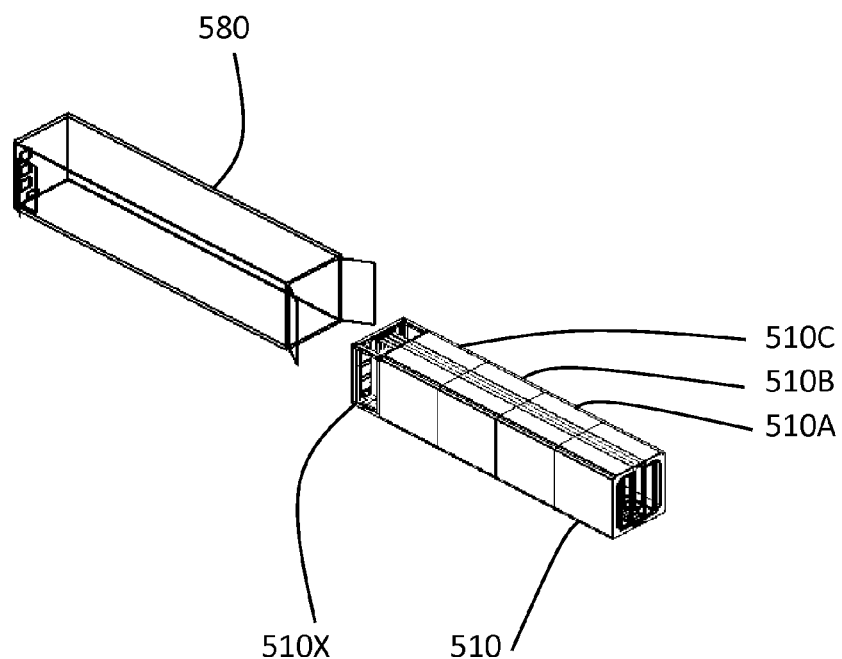
FIG. 34 is an exploded perspective view of an embodiment of the present invention showing several linked modules and a ½ module, each of which are external of a container.

Turning now to FIGS. 32-34, it is seen that an additional alternative embodiment of the present invention is illustrated.

Module 510 is provided having a walled structure 520, bearing plates 530 and 535 and ducting. Each of these components is described below. It is apparent that module 510 has many similarities to with module 410, yet is different in many respects.

Walled structure 520 has a first end 521 and a second end 522, a first side 523 and a second side 524, and a top 525 and a bottom 526. Walled structure has a generally rectangular cross-sectional dimension with a raised central portion for increased interior height. The walled structure further has an inner wall 527 and an outer wall 528.

A first bearing plate 530 supports a first equipment rack 531. The bearing plate 530 is spaced a selected distance interior of the first side 523 of the walled structure. A second bearing plate 535 supports a second equipment rack 536. Bearing plate 535 is spaced a selected distance interior of the second side 524 of the walled structure. The first bearing plate 530 and second bearing plate 535 are parallel to each other and are separated by separation surface 537. Separation surface has several lateral openings 538 there through.

Ducting is defined as the interior of the walled structure 520 between the inner wall 527 and the outer wall 528. In this regard, the walled structure or wall forms the ducting. A ducting first side is within the first side 523 of the walled structure, and a ducting second side is within the second side 524 of the walled structure. The ducting has a top and a bottom. Intakes are at the top of the ducting. A single return is provided preferably centrally at the bottom of the ducting, wherein cooled air enters the cold aisle via openings 538 in the floor 538. It is appreciated that while not specifically illustrated, that a heat exchanger and a fan are preferably located within each side and of the ducting to cool and move the air within the first side and second side of the ducting, respectfully. The heat exchangers are segregated from the equipment within the equipment racks.

A cross-over conduit structure 560 is provided and is centrally located within the top of the walled structure 520.

As seen in FIG. 33, a single cold aisle 570, and two opposed hot aisles 571 and 572 are provided. In this regard, a hot aisle/cold aisle/hot aisle configuration is provided within a single robust structure.

It is appreciated that the bearing plates may be translating surfaces or stationary surfaces without departing from the broad aspects of the present invention. Further, it is appreciated that one of several types of transport structures may be used to move the module 510 to an intended destination. As seen in FIG. 34, one such destination for a series of longitudinally linked modules 510, 510A, 510B, 510C and 510X is a container 580. Of course, many other types of containers may be used without departing from the broad aspects of the present invention. Modules can also be placed in a vertically stacked arrangement.

Figure 35:
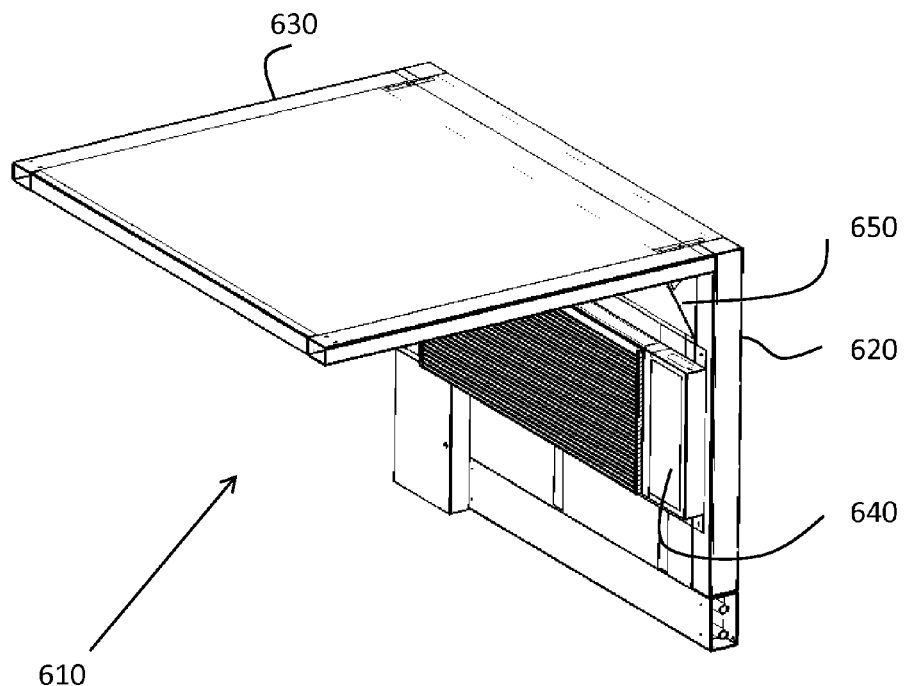
FIG. 35 is a perspective view of an alternative embodiment of the present invention.

Looking now at FIG. 35, it is seen that an assembly 610 is provided having a vertical wall 620 and a horizontal wall 630. A heat exchanger assembly 640 can be supported by the vertical wall. A ducting assembly can also be provided. This assembly resembles in some respects the above embodiments, yet is distinct in other ways. The assembly 610 neither has a foundation nor a wall opposite of the wall that supports the heat exchanger assembly 640. Nevertheless, the assembly 610 is useful in a defined enclosed environment. Ducting 650 can be provided for routing air through the assembly 610 via either free or forced flow.

In each embodiment illustrated herein, there is a net positive pressure in the cold aisle when compared to the pressure in the hot aisle. In this regard, the natural tendency of the air flow is to move from the cold aisle, across the equipment, and into the hot aisle.

It is also appreciated that when access to the interior of the module is not an operational concern, that multiple rows of racks can be placed in a side by side manner within the module.

Figure 36:
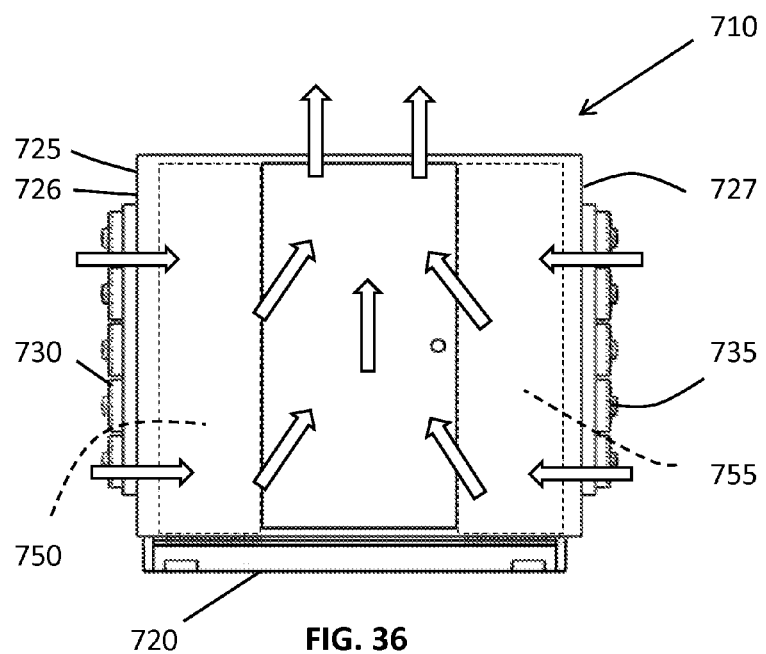
FIG. 36 is an end view of an alternative embodiment of the present invention.
Figure 37:
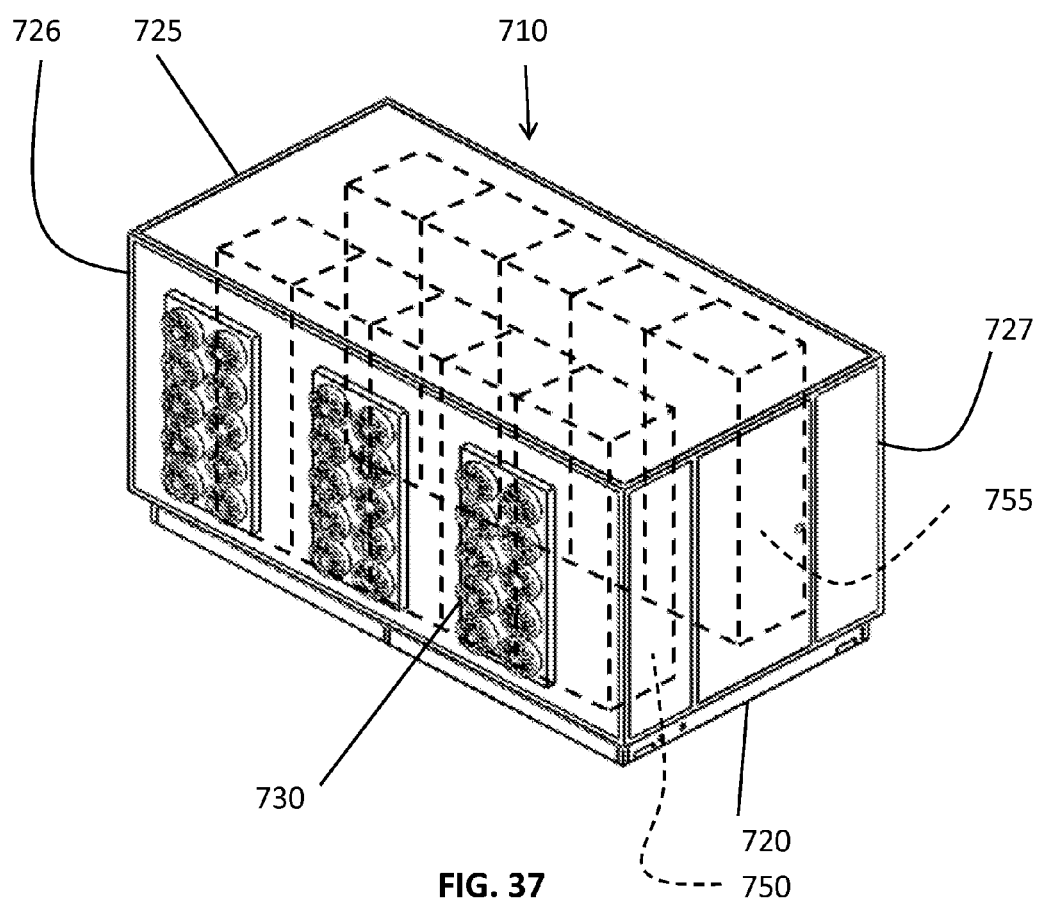
FIG. 37 is a perspective view of the alternative embodiment illustrated in FIG. 36.

It is also understood that in each illustrated embodiment, the perimeter dimensions shown above are preferred dimensions that may be altered without departing from the broad aspects of the present invention. In this regard, and looking at FIGS. 36 and 37 for example, it is seen that a widened module 710 is provided having a foundation 720 and a wall structure 725. The wall structure 725 has a first side 726 and a second side 727. A first heat exchanger assembly 730 is at the first side 726 and a second heat exchanger assembly 735 is at the second side 727. It is preferred that each heat exchanger assembly has a filtered fresh air intake. Ducting can be to provide recirculation of air through the heat exchangers in embodiments employing a recirculation option. A first equipment rack 750 and a second equipment rack 755 are provided in spaced apart arrangement. The air can exhaust vertically through the top of the module 710, or through another location.

Thus it is apparent that there has been provided, in accordance with the invention, a modular integrated mobile cooling system that fully satisfies the objects, aims and advantages as set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. An assembly for directing a flow of air and comprising:
    a foundation supporting at least one equipment rack;
    a skeleton having a skeleton first side and a skeleton second side, a first area between said skeleton first side and said at least one equipment rack defining a hot aisle and a second area between said skeleton second side and said at least one equipment rack defining a cold aisle, said hot aisle and said cold aisle being generally parallel to each other and to said skeleton first side;
    a heat exchanger supported by said skeleton; and
    a ductwork assembly supported by said skeleton, said ductwork assembly routing a selected amount of air from said hot aisle through said heat exchanger and into said cold aisle,
    wherein said selected amount of air rises vertically as it moves within said hot aisle,
    wherein said selected amount of air rises vertically within said hot aisle due to natural buoyancy; and
    wherein said ductwork assembly passes over said at least one equipment rack and said selected amount of air passes laterally over said at least one equipment rack within said ductwork assembly.

2. The assembly of claim 1 wherein said ductwork assembly is generally perpendicular to said hot aisle.

3. The assembly of claim 1 wherein said ductwork assembly has an inlet within said hot aisle.

4. The assembly of claim 3 further comprising an air mover to force air into said inlet of said ductwork assembly.

5. The assembly of claim 1 further comprising:
    a plenum vertically oriented and mounted to said skeleton second side; and a panel having a plurality of fans,
wherein a said heat exchanger is within said plenum and said plurality of fans cause air to move through said heat exchanger and into said cold aisle.

6. The assembly of claim 1 further comprising a fresh air intake for intaking a selected amount of fresh air into said cold aisle and an exhaust directly exhausting air from said hot aisle, and wherein said fresh air intake and said heat exchanger are each selectably operable via electro-mechanical adjustment depending on ambient environmental conditions.

\* \* \* \* \*